(12) United States Patent
Kameyama et al.

(10) Patent No.: US 7,907,652 B2
(45) Date of Patent: Mar. 15, 2011

(54) SEMICONDUCTOR LASER DEVICE

(75) Inventors: Shingo Kameyama, Ibaraki (JP);
Yasuhiko Nomura, Osaka (JP);
Masayuki Hata, Kadoma (JP)

(73) Assignee: Sanyo Electric Co., Ltd., Osaka (JP)

( * ) Notice: Subject to any disclaimer, the term of this patent is extended or adjusted under 35 U.S.C. 154(b) by 350 days.

(21) Appl. No.: 12/109,124

(22) Filed: Apr. 24, 2008

(65) Prior Publication Data
US 2008/0317080 A1 Dec. 25, 2008

(30) Foreign Application Priority Data

Apr. 25, 2007 (JP) .................... 2007-115539
Apr. 21, 2008 (JP) .................... 2008-109782

(51) Int. Cl.
*H01S 5/00* (2006.01)
(52) U.S. Cl. .................... 372/44.01; 372/43.01
(58) Field of Classification Search ............ 372/44.01
See application file for complete search history.

(56) References Cited

U.S. PATENT DOCUMENTS

| 2003/0165169 A1 | 9/2003 | Nomoto et al. | |
| 2007/0064758 A1* | 3/2007 | Kuramoto et al. | 372/43.01 |

FOREIGN PATENT DOCUMENTS

| GB | 2105100 A | 3/1983 |
| JP | 58-033885 A | 2/1983 |
| JP | 2001015861 A | 1/2001 |
| JP | 2001-274501 A | 5/2001 |
| JP | 2003-017793 A | 1/2003 |
| JP | 2003-031895 | * 1/2003 |
| JP | 2003-031895 A | 1/2003 |
| JP | 200337323 A | 2/2003 |
| JP | 2003158328 A | 5/2003 |
| JP | 2003-174114 A | 6/2003 |
| JP | 2003258370 A | 9/2003 |
| JP | 2005072052 A | 3/2005 |
| JP | 2006-41085 A | 2/2006 |
| JP | 2007-81283 A | 3/2007 |
| JP | 2007053243 A | 3/2007 |
| JP | 2007103542 A | 4/2007 |

OTHER PUBLICATIONS

Japanese Office Action for corresponding JP Application No. 2008-109782, Dec. 6, 2008, Japan.

* cited by examiner

*Primary Examiner* — Minsun Harvey
*Assistant Examiner* — Xnning Niu
(74) *Attorney, Agent, or Firm* — Ditthavong Mori & Steiner, P.C.

(57) ABSTRACT

In this semiconductor laser device, a semiconductor laser element is so fixed to a base that a distance between a convex side of a warp thereof and the base varies with the warp of the semiconductor laser element at least along a first direction corresponding to an extensional direction of a cavity or a second direction, while a wire bonding portion is provided around a portion of an electrode layer corresponding to the vicinity of a region where the distance between the convex side of the warp of the semiconductor laser element in at least either the first direction or the second direction of the semiconductor laser element and the base is substantially the smallest.

16 Claims, 23 Drawing Sheets

SEMICONDUCTOR LASER DEVICE

CROSS-REFERENCE TO RELATED APPLICATIONS

The priority application number JP2007-115539, Semiconductor Laser Device, Apr. 25, 2007, Shingo Kameyama et al, JP2008-109782, Semiconductor Laser Device, Apr. 21, 2008, Shingo Kameyama et al, upon which this patent application is based are hereby incorporated by reference.

BACKGROUND OF THE INVENTION

1. Field of the Invention

The present invention relates to a semiconductor laser device, and more particularly, it relates to a semiconductor laser device comprising a semiconductor laser element fixed to a base.

2. Description of the Background Art

A low-output nitride-based semiconductor laser for reproduction has recently been put into practice as the light source for the next-generation optical disk, while a high-output nitride-based semiconductor laser for high-speed recording is in the process of practicalization. In order to assemble a nitride-based semiconductor laser, a nitride-based semiconductor laser element is die-bonded to a seat of a metal stem through a submount with a conductive bonding layer of gold (Au), tin (Sn) or the like, and thereafter wire-bonded with gold. Thereafter the nitride-based semiconductor laser element is sealed with a cap transmitting a laser beam. In general, the side of the nitride-based semiconductor laser element provided with a gallium nitride substrate is die-bonded to the seat of the metal stem.

In a conventional nitride-based semiconductor laser, however, a nitride-based semiconductor layer is formed on a substrate of sapphire, silicon or silicon carbide by epitaxially growing a nitride-based semiconductor, and hence a semiconductor laser element is warped due to the differences between the thermal expansion coefficients and the lattice constants of the substrate and the nitride-based semiconductor layer.

In relation to this, a method of manufacturing a semiconductor laser device in consideration of a warp of a semiconductor laser element is known in general, as disclosed in Japanese Patent Laying-Open No. 2003-31895, for example.

The aforementioned Japanese Patent Laying-Open No. 2003-31895 proposes a method of manufacturing a semiconductor laser device by die-bonding a semiconductor light-emitting device chip to a mount member provided with a curved mount surface having a prescribed radius of curvature and a collet provided with a curved pressing surface also having the prescribed radius of curvature for pressing the die-bonded semiconductor light-emitting device chip from above. Thus, the semiconductor light-emitting device chip is fixed to the mount member in a state warped in a prescribed direction.

According to a conventional semiconductor laser device and the method of manufacturing the same disclosed in Japanese Patent Laying-Open No. 2003-31895, however, the semiconductor light-emitting device chip (semiconductor laser element) is die-bonded to the mount member (base) in the state warped in the prescribed direction with the mount member and the collet provided with the curved surfaces each having the prescribed fixed radius of curvature, and hence it is difficult to cope with dispersion in the warp of each semiconductor light-emitting device chip. If the semiconductor light-emitting device chip has a warp different from the shape of the curved surface of the mount member due to dispersion in the warp thereof, stress is disadvantageously caused in the semiconductor light-emitting device chip when the warp of the semiconductor light-emitting device chip mounted on the mount member is corrected in response to the shape of the curved surface of the mount member. Consequently, laser characteristics are deteriorated, and the semiconductor light-emitting device chip is broken. Particularly when a nitride-based semiconductor laser is formed with a high output, a warp of a device chip and dispersion in the warp are increased due to a long cavity length (length of the device chip), disadvantageously easily leading to the aforementioned problems.

SUMMARY OF THE INVENTION

A semiconductor laser device according to an aspect of the present invention comprises a semiconductor laser element having a warp along at least either a first direction corresponding to an extensional direction of a cavity or a second direction intersecting with the first direction, an electrode layer formed on a surface of a concave side of the warp of the semiconductor laser element and provided with a wire bonding portion, and a base to which a convex side of the warp of the semiconductor laser element is fixed, wherein the semiconductor laser element is so fixed to the base that a distance between the convex side of the warp of the semiconductor laser element and the base varies with the warp of the semiconductor laser element along at least either the first direction corresponding to the extensional direction of the cavity or the second direction while the wire bonding portion is provided around a portion of the electrode layer corresponding to the vicinity of a region where the distance between the convex side of the warp of the semiconductor laser element in at least either the first direction or the second direction of the semiconductor laser element and the base is substantially the smallest.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First, the structure of a semiconductor laser device 1 according to the present invention is schematically described with reference to FIG. 1, before specifically illustrating the embodiments of the present invention.

Figure 1:
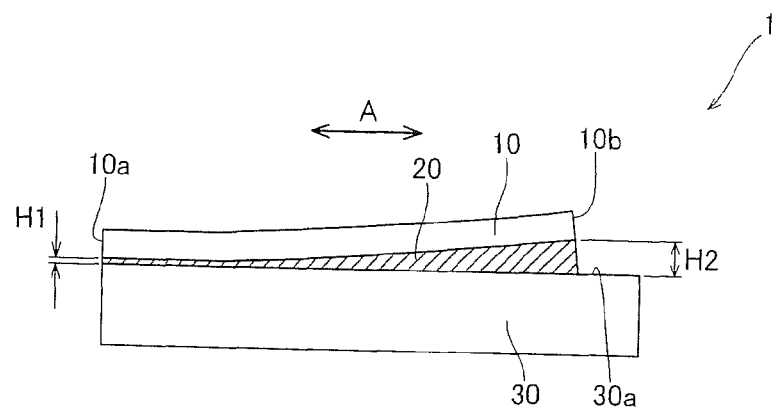
FIG. 1 is a sectional view for schematically illustrating the structure of a semiconductor laser device according to the present invention.

In the semiconductor laser device 1 according to the present invention, a semiconductor laser element 10 is fixed to a base 30 through a conductive bonding layer 20 formed by a metal layer or the like, as shown in FIG. 1. The conductive bonding layer 20 is an example of the "fusible layer" in the present invention.

The semiconductor laser element 10 has a warp along the extensional direction (along arrow A) of a cavity. The semiconductor laser element 10 has a light emitting surface 10*a* and a light reflecting surface 10*b* provided on both ends in the extensional direction (along arrow A) of the cavity respectively. The light emitting surface 10*a* is an example of the "light emitting end" in the present invention, and the light reflecting surface 10*b* is an example of the "light reflecting end" in the present invention. In the present invention, The light emitting surface 10*a* and the light reflecting surface 10*b* are distinguished from each other through the large-small direction between the strength levels of a laser beam emitted from cavity facets on the light emitting side and the light reflecting side respectively. In other words, the light emitting surface 10*a* has relatively larger laser beam strength, and the light reflecting surface 10*b* has relatively smaller laser beam strength.

In the semiconductor laser device 1 according to the present invention, the convex side of the warp of the semiconductor laser element 10 is fixed to the upper surface 30*a* of the base 30.

The semiconductor laser element 10 can be prepared by forming a semiconductor layer (semiconductor laser element portion) on a substrate such as a gallium nitride substrate, a sapphire substrate, a silicon substrate or a silicon carbide substrate.

Multilayer dielectric films may be formed on the light emitting surface 10*a* and the light reflecting surface 10*b* of the semiconductor laser element 10 respectively.

First Embodiment

The structures of a semiconductor laser device 40 according to a first embodiment of the present invention and a semiconductor laser comprising the same are described with reference to FIGS. 2 to 7.

Figure 2:
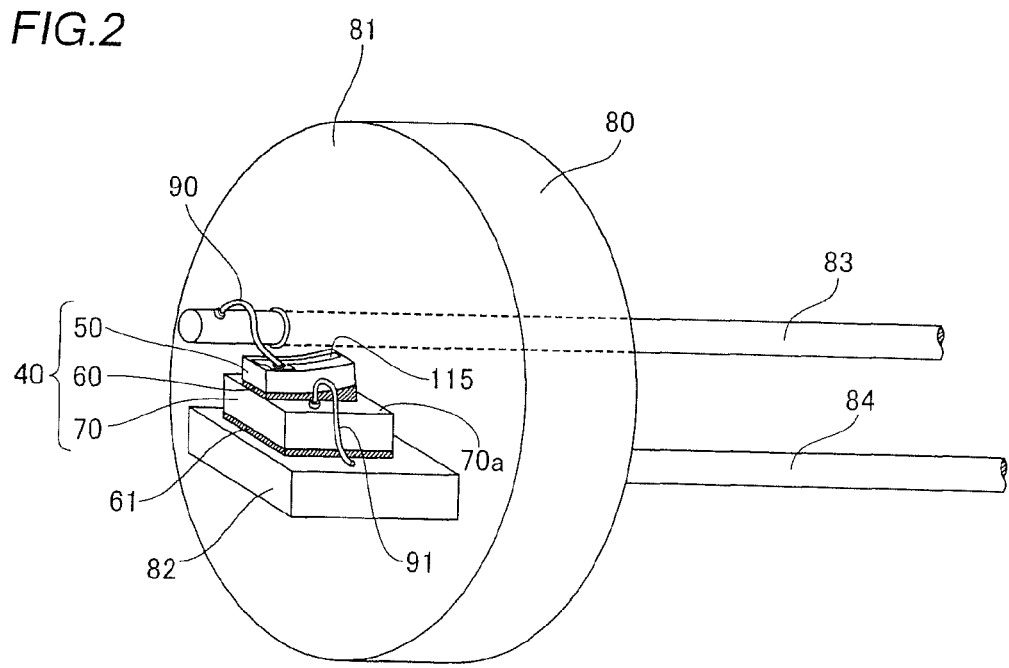
FIG. 2 is a perspective view showing the structure of a semiconductor laser comprising a semiconductor laser device according to a first embodiment of the present invention.
Figure 3:
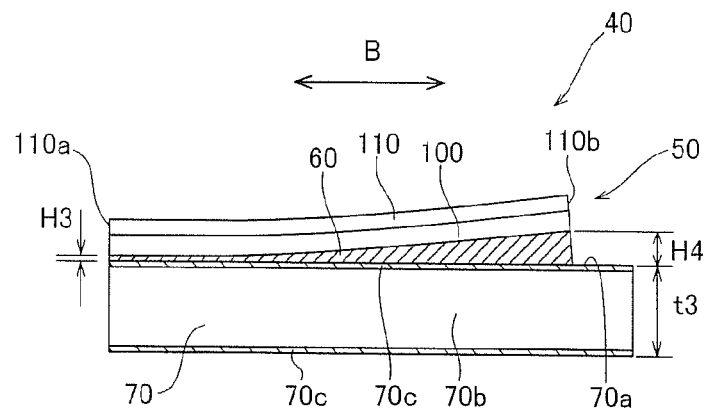
FIG. 3 is a sectional view showing the structure of the semiconductor laser device according to the first embodiment of the present invention.

In the semiconductor laser comprising the semiconductor laser device 40 according to the first embodiment, a semiconductor laser element 50 is fixed to a base 70 through a conductive bonding layer 60 of AuSn or the like, as shown in FIGS. 2 and 3. The conductive bonding layer 60 is an example of the "fusible layer" in the present invention. The base 70 is fixed to a seat portion 82 provided on a body portion 81 of a metal stem 80 through another conductive bonding layer 61 of AuSn or the like, as shown in FIG. 2. The stem 80 is provided with two lead terminals 83 and 84.

The upper surface of the semiconductor laser element 50 is wire-bonded to the lead terminal 83 of the stem 80 with an Au wire 90, as shown in FIG. 2. The upper surface 70a of the base 70 is wire-bonded to the seat portion 82 of the stem 80 with an Au wire 91. A windowed cap (not shown) transmitting a laser beam is mounted on the body portion 81 of the stem 80.

Figure 4:
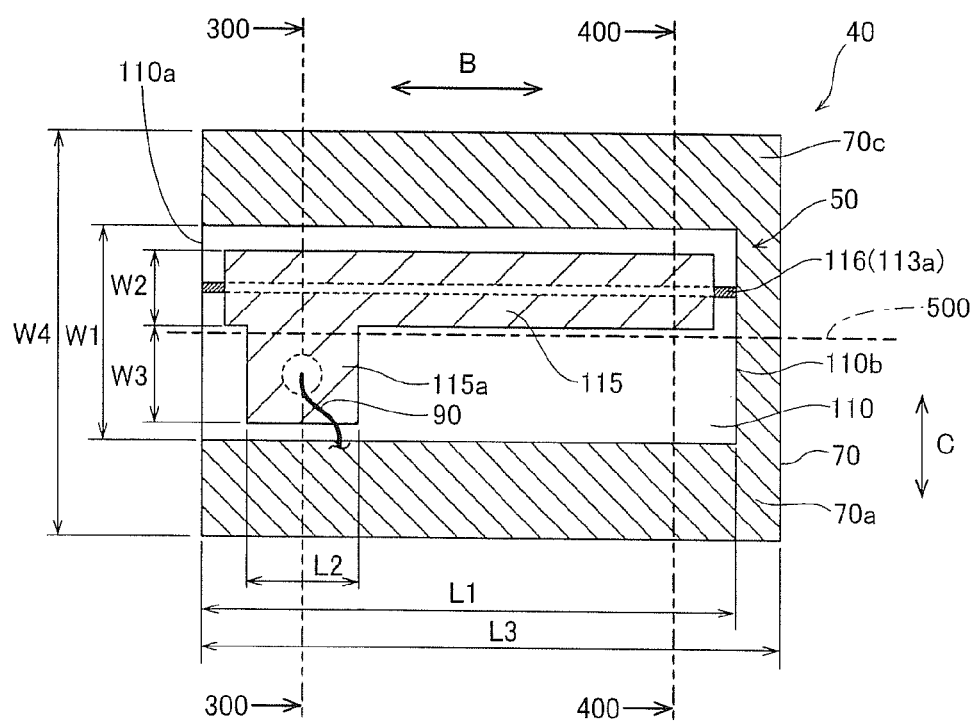
FIG. 4 is a plan view showing the structure of the semiconductor laser device according to the first embodiment of the present invention shown in FIG. 3.
Figure 5:
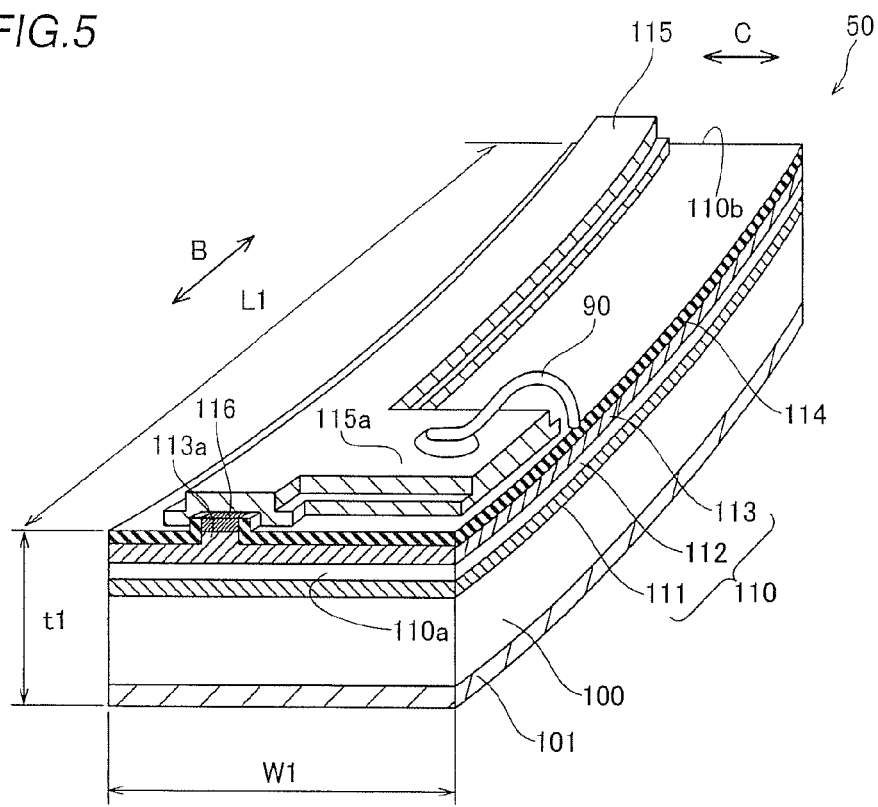
FIG. 5 is a perspective view showing the structure of a semiconductor laser element of the semiconductor laser device according to the first embodiment of the present invention shown in FIG. 3.

The semiconductor laser element 50 has a width (W1) of about 200 μm, a length (L1) of 1000 μm in the extensional direction (along arrow B) of a cavity and a thickness (t1) (see FIG. 5) of about 100 μm, as shown in FIGS. 4 and 5. The direction B is an example of the "first direction" in the present invention.

According to the first embodiment, the semiconductor laser element 50 is constituted of a substrate 100 arranged on the side of the base 70 and a semiconductor laser element portion 110 arranged on the side opposite to the base 70, as shown in FIG. 3. The substrate 100 is an example of the "substrate" in the present invention.

Figure 6:
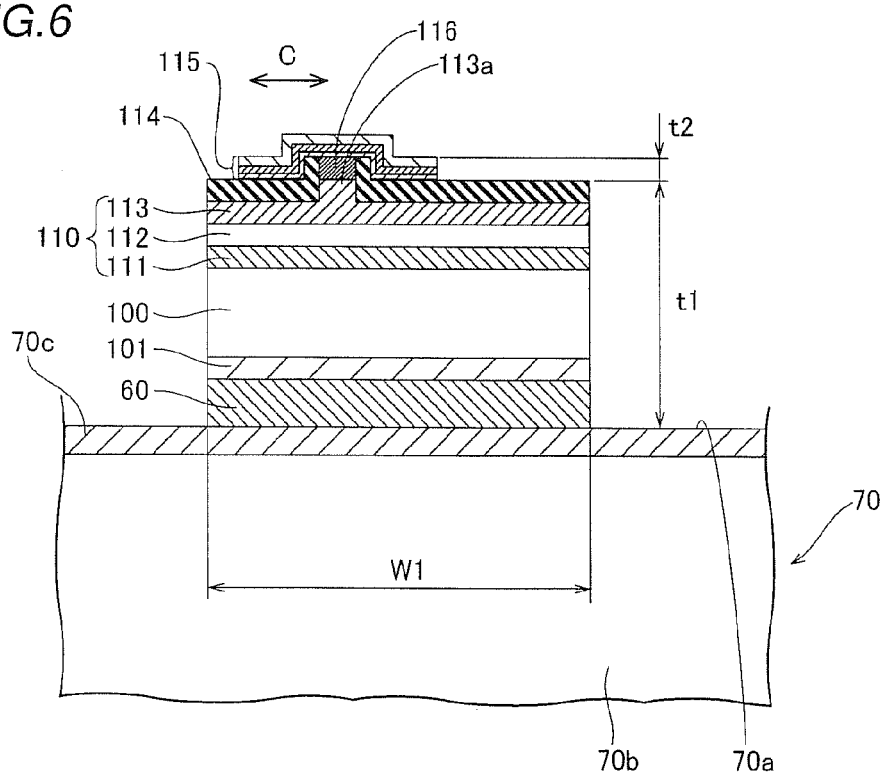
FIG. 6 is a sectional view taken along the line 400-400 in FIG. 4.

More specifically, an n-type AlGaN clad layer 111, an active layer 112 of GaInN and a p-type AlGaN clad layer 113 are formed on the upper surface of the substrate 100 of gallium nitride, silicon or silicon carbide by epitaxial growth, as shown in FIGS. 5 and 6. These nitride-based semiconductor layers, i.e., the n-type AlGaN clad layer 111, the active layer 112 and the p-type AlGaN clad layer 113 constitute the semiconductor laser element portion 110. The n-type AlGaN clad layer 111, the active layer 112 and the p-type AlGaN clad layer 113 are examples of the "nitride-based semiconductor layer" in the present invention. The p-type AlGaN clad layer 113 is provided with a ridge portion 113a extending along arrow B (see FIG. 5), thereby forming a waveguide structure. The ridge portion 113a is so formed as to have a width of about 2 μm. The semiconductor laser element portion 110 is provided with a light emitting surface (cavity facet) 110a and a light reflecting surface (cavity facet) 110b on ends along arrow B respectively, as shown in FIG. 3. The light emitting surface 110a is an example of the "light emitting end" in the present invention, and the light reflecting surface 110b is an example of the "light reflecting end" in the present invention. The light emitting surface 110a, the light reflecting surface 110b and the waveguide structure constitute the cavity extending along arrow B. Multilayer dielectric films (not shown) are formed on the light emitting surface 110a and the light reflecting surface 110b respectively. An insulating film 114 of $SiO_2$ is formed on the upper surface of the p-type AlGaN clad layer 113 excluding the ridge portion 113a, as shown in FIGS. 5 and 6.

An n-side electrode 101 consisting of an Au film is formed on the lower surface of the substrate 100, as shown in FIGS. 5 and 6. According to the first embodiment, the lower surface of the n-side electrode 101 is die-bonded to the base 70. A p-side electrode 115 consisting of an Au film is formed on the upper surfaces of the ridge portion 113a of the p-type AlGaN clad layer 113 and the insulating film 114 along the extensional direction (along arrow B) (see FIG. 5) of the ridge portion 113a. An ohmic layer 116 consisting of a Pt layer having a thickness of about 1 nm, a Pd layer having a thickness of about 30 nm and a Ti layer having a thickness of about 1 nm is formed on the upper portion of the ridge portion 113a in order to reliably electrically connect the ridge portion 113a (clad layer) and the p-side electrode 115 with each other, as shown in FIGS. 5 and 6. The p-side electrode 115 is formed by stacking a Pt layer having a thickness of about 9 nm and a Pd layer having a thickness of about 150 nm, and the outermost surface thereof is covered with an Au film having a thickness of about 2.2 μm.

As shown in FIG. 4, the p-side electrode 115 has a width (W2) of about 20 μm and a thickness (t2) (see FIG. 6) of about 2.2 μm. The length of the p-side electrode 115 is slightly smaller than the length L1 of the cavity (semiconductor laser element 50).

According to the first embodiment, the semiconductor laser element 50 has a warp of about 0.5 μm to about 3 μm along the extensional direction (along arrow B) of the cavity as shown in FIGS. 3 and 5, depending on the type and the quantity of an additional element in the heterojunction. In the other word, the semiconductor laser element 50 is so warped that an upper surface (first main surface) is concaved and a lower surface (second main surface) is convexed. The surface of the semiconductor laser element portion 110 opposite to the substrate 100 is concaved, and the convex side (provided with the substrate 100) of the warp of the semiconductor laser element 50 is fixed to the base 70 (see FIG. 3). This warp of the semiconductor laser element 50 results from the differences between the thermal expansion coefficients and the lattice constants of the substrate 100 and the semiconductor laser element portion 110.

More specifically, gallium nitride has a thermal expansion coefficient of about $5.59 \times 10^{-6}$/K and a lattice constant of about 0.3189 nm in the a-axis direction respectively. Silicon has a thermal expansion coefficient of about $2.6 \times 10^{-6}$/K and a lattice constant of about 0.543 nm in the a-axis direction respectively. Silicon carbide has a thermal expansion coefficient of about $4.2 \times 10^{-6}$/K and a lattice constant of about 0.3081 nm in the a-axis direction respectively. AlGaN employed as the main material for the semiconductor laser element portion 110 according to the present invention has a thermal expansion coefficient of about $4.15 \times 10^{-6}$/K to about $5.59 \times 10^{-6}$/K and a lattice constant of about 0.3112 nm to about 0.3189 nm in the a-axis direction respectively. GaInN employed as the material for the active layer 112 of the semiconductor laser element portion 110 according to the present invention has a thermal expansion coefficient of about $3.8 \times 10^{-6}$/K to about $5.59 \times 10^{-6}$/K and a lattice constant of about 0.3189 nm to about 0.3533 nm in the a-axis direction respectively.

TABLE 1

| Material | Thermal Expansion Coefficient ($10^{-6}$/K) a-axis direction | Lattice Constant (nM) a-axis direction | Shape of Surface of Element |
| --- | --- | --- | --- |
| AlGaN (Main Material for Element Portion according to the Present Invention) | 4.15~5.59 | 0.3112~0.3189 | |

TABLE 1-continued

| Material | Thermal Expansion Coefficient (10$^{-6}$/K) a-axis direction | Lattice Constant (nM) a-axis direction | Shape of Surface of Element |
|---|---|---|---|
| GaN (Gallium Nitride Substrate) | 5.59 | 0.3189 | Concave |
| SiC (6H) (Silicon Carbide Substrate) | 4.2 | 0.3081 | Concave |
| Si (Silicon Substrate) | 2.6 | 0.543 | Concave |
| GaInN (Active Layer according to the Present Invention) | 3.8~5.59 | 0.3189~0.3533 | |

If the substrate 100 is made of gallium nitride, the semiconductor laser element 50 is so warped that the side provided with the substrate 100 is convexed (the side provided with the semiconductor laser element portion 110 is concaved) due to the lattice constant, smaller than that of the substrate 100, of the n-type and p-type AlGaN clad layers 111 and 113 constituting the semiconductor laser element portion 110. While the active layer 112 has a larger lattice constant than the substrate 100, the semiconductor laser element 50 is so warped that the side provided with the substrate 100 is convexed conceivably because the thickness of the active layer 112 is smaller than those of the n-type and p-type AlGaN clad layers 111 and 113. If the substrate 100 is made of silicon or silicon carbide, on the other hand, the semiconductor laser element 50 is so warped that side provided with the substrate 100 is convexed (the side provided with the semiconductor laser element portion 110 is concaved) conceivably because the thermal expansion coefficients of the n-type AlGaN clad layer 111, the active layer 112 and the p-type AlGaN clad layer 113 constituting the semiconductor laser element portion 110 are larger than that of the substrate 100.

According to the first embodiment, the semiconductor laser element 50 is so fixed to the base 70 through the conductive bonding layer 60 that the distance between the convex side (provided with the substrate 100) of the warp of the semiconductor laser element 50 and the base 70 varies with the warp of the semiconductor laser element 50 along the extensional direction (along arrow B) of the cavity, as shown in FIG. 3.

More specifically, the conductive bonding layer 60 of AuSn or the like is so formed that the distance (thickness of the conductive bonding layer 60) H3 between the semiconductor laser element 50 and the base 70 around the light emitting surface 110a of the cavity of the semiconductor laser element 50 is smaller than the distance (thickness of the conductive bonding layer 60) H4 between the semiconductor laser element 50 and the base 70 around the light reflecting surface 110b of the cavity of the semiconductor laser element 50 for fixing the side of the semiconductor laser element 50 provided with the substrate 100 to the base 70 through the conductive bonding layer 60, as shown in FIG. 3. According to the first embodiment, solder is employed as the material for the conductive bonding layer 60.

As shown in FIG. 6, the conductive bonding layer 60 has the same width (W1=about 200 μm) and the same length (L1=about 1000 μm) (see FIG. 5) as the semiconductor laser element 50, and a thickness of about 1 to 5 μm. The semiconductor laser element 50 is not warped in the cross direction (along arrow C) of the cavity. Therefore, the semiconductor laser element 50 is fixed to the base 70 in view of the warped shape along arrow B as shown in FIG. 3. The direction C is an example of the "second direction" in the present invention As shown in FIG. 3, the light emitting surface 110a of the semiconductor laser element 50 is arranged substantially parallelly to the upper surface 70a of the base 70. In other words, the semiconductor laser element 50 is so arranged that the direction of a laser beam emitted from the light emitting surface 110a is substantially parallel to the extensional direction of the upper surface 70a of the base 70.

According to the first embodiment, a wire bonding portion 115a provided on the p-side electrode 115 of the semiconductor laser element 50 is arranged on the upper surface of the insulating film 114 around the light emitting surface 110a, as shown in FIGS. 4 and 5. In other words, the wire bonding portion 115a is provided on a portion of the p-side electrode 115 corresponding to the vicinity of a region (where the conductive bonding layer 60 substantially has the thickness H3 (see FIG. 3)) where the distance between the semiconductor laser element 50 and the base 70 is substantially the smallest. The wire bonding portion 115a has a width (W3) of about 80 μm to about 90 μm, a length (L2) of about 50 μm to about 60 μm along arrow B and the same thickness (t2) (see FIG. 7) of about 2.2 μm as the p-side electrode 115, as shown in FIG. 4.

Figure 7:
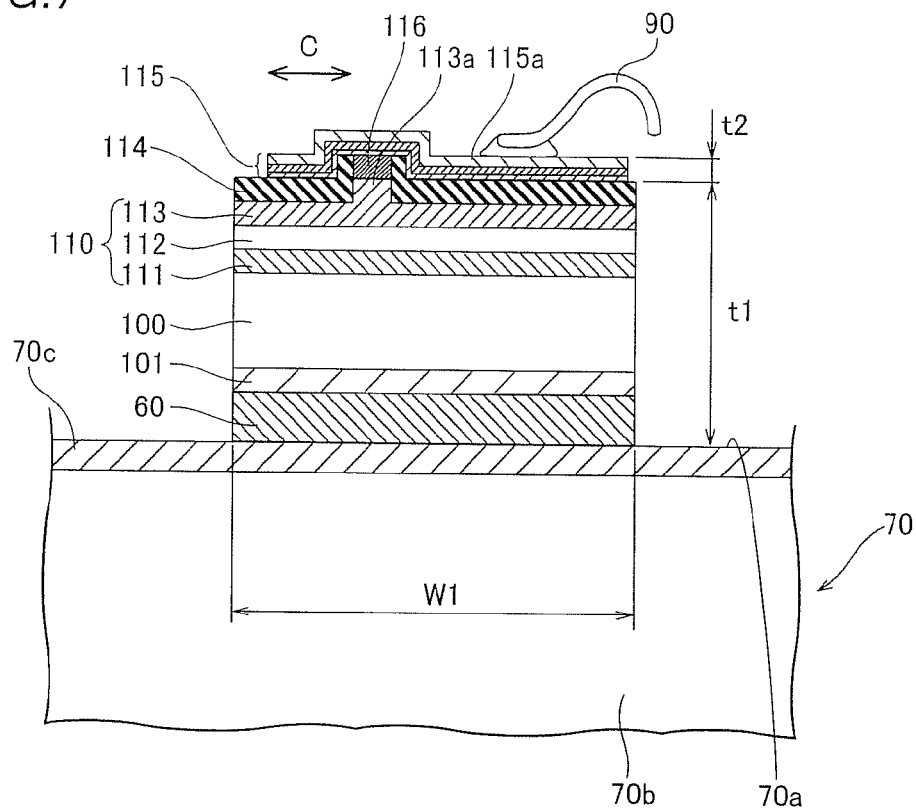
FIG. 7 is a sectional view taken along the line 300-300 in FIG. 4.

According to the first embodiment, the ridge portion 113a and the p-side electrode 115 of the semiconductor laser element 50 are so formed as to extend substantially parallelly to a centerline 500 (shown by a one-dot chain line) (see FIG. 4) of the cavity of the semiconductor laser element 50 in the cross direction (along arrow C) at a prescribed distance (about 20 μm) from the centerline 500, as shown in FIGS. 4, 5 and 7. The wire bonding portion 115a protrudes from the p-side electrode 115 formed immediately above the ridge portion 113a through the ohmic layer 116 in the cross direction (along arrow C) of the semiconductor laser element 50, and is provided on the upper surface of the insulating film 114 in the region provided with no ridge portion 113b across the centerline 500 (see FIG. 4).

The base 70 has a width (W4) of about 900 μm, a length (L3) of about 1200 μm and a thickness (t3) (see FIG. 3) of about 250 μm, as shown in FIG. 4.

The base 70 includes a substrate 70b of SiC or AlN, as shown in FIGS. 3 and 6. A metal underlayer 70c consisting of a Ti layer having a thickness of about 100 nm, a Pt layer having a thickness of about 20 nm and an Au layer having a thickness of about 30 nm is formed on the overall upper and lower surfaces of the substrate 70b. This metal underlayer 70c is provided for bonding the conductive bonding layer 60 to the base 70.

A manufacturing process for the semiconductor laser comprising the semiconductor laser device 40 according to the first embodiment is now described with reference to FIGS. 2, 3, 5 and 8.

First, the semiconductor laser element portion 110 is formed by epitaxially growing the n-type AlGaN clad layer 111, the active layer 112 of GaInN and the p-type AlGaN clad layer 113 on the upper surface of the substrate 100, as shown in FIG. 5. Then, the ridge portion 113a extending along arrow B is formed on the p-type AlGaN clad layer 113, and the insulating film 114 of SiO$_2$ is thereafter formed on the upper surface of the p-type AlGaN clad layer 113 excluding the ridge portion 113a. Thereafter the n-side electrode 101 consisting of the Au film is formed on the lower surface of the substrate 100, while the ohmic layer 116 consisting of the Pt layer, the Pd layer and the Ti layer is formed on the upper surface of the ridge portion 113a of the p-type AlGaN clad layer 113. Then, the p-side electrode 115 having the outermost surface consisting of the Au film is formed on the upper surfaces of the ohmic layer 115 and the insulating film 114. Then, the multilayer dielectric films (not shown) are formed on the light emitting surface 110a and the light reflecting surface 110b of the semiconductor laser element portion 110 respectively, thereby forming the semiconductor laser element 50. At this time, the semiconductor laser element 50 is so warped that the side provided with the substrate 100 is convexed (the side provided with the semiconductor laser element portion 110 is concaved) due to the differences between the thermal expansion coefficients and the lattice constants of the substrate 100 and the semiconductor laser element portion 110, as shown in FIG. 5.

According to the first embodiment, the convex side (provided with the substrate 100) of the warp of the semiconductor laser element 50 is thereafter so die-bonded to the base 70 that the distance (thickness of the conductive bonding layer 60) H3 between the semiconductor laser element 50 and the base 70 around the light emitting surface 110a of the cavity of the semiconductor laser element 50 is smaller than the distance (thickness of the conductive bonding layer 60) H4 between the semiconductor laser element 50 and the base 70 around the light reflecting surface 110b of the cavity of the semiconductor laser element 50, as shown in FIG. 3. At the same time, the base 70 is fixed to the seat portion 82 (see FIG. 2) of the stem 80.

Figure 8:
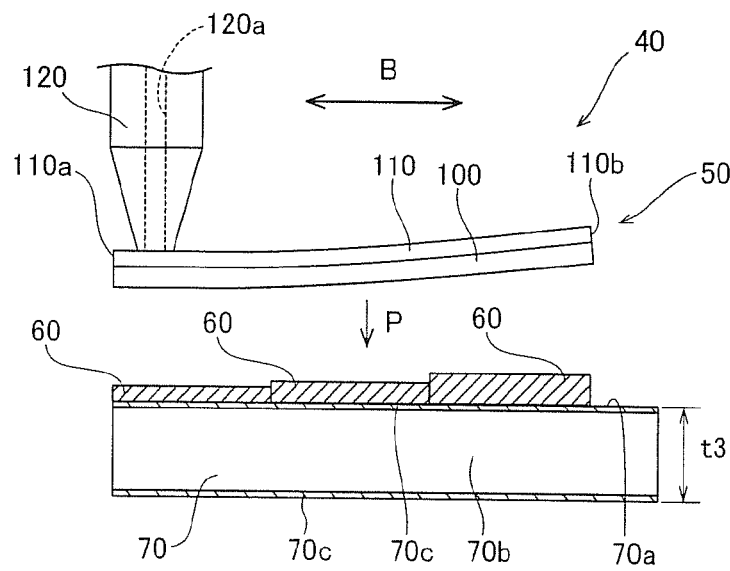
FIG. 8 is a diagram for illustrating a manufacturing process for the semiconductor laser comprising the semiconductor laser device according to the first embodiment of the present invention.

More specifically, the conductive bonding layer 61 (see FIG. 2), the base 70 having the conductive bonding layer 60 arranged on a prescribed region and the semiconductor laser element 50 are successively arranged on the seat portion 82 (see FIG. 2) of the metal stem 80 (see FIG. 2) in a nitrogen atmosphere, as shown in FIG. 8.

According to the first embodiment, the conductive bonding layer 60 is so arranged on the upper surface 70a of the base 70 that the thickness thereof changes in three ways (three stages) in the longitudinal direction (along arrow B) of the cavity, as shown in FIG. 8. In other words, the conductive bonding layer 60 of solder is so arranged on the upper surface 70a of the base 70 that the thickness thereof increases stepwise from around the light emitting surface 110a toward the light reflecting surface 110b.

According to the first embodiment, the stem 80 (see FIG. 2) is heated to a high temperature, and a portion of the semiconductor laser element 50 around the light emitting surface 110a is pressed with a collet 120 of ceramic toward the base 70 along arrow P through the conductive bonding layer 60, as shown in FIG. 8. When the portion of the semiconductor laser element 50 around the light emitting surface 110a is pressed with the collet 120, the region (around the light emitting surface 110a of the semiconductor laser element 50) of the conductive bonding layer 60 pressed with the collet 120 is fused to move to another region (around the light reflecting surface 110b of the semiconductor laser element 50) not pressed with the collet 120, while the region of the conductive bonding layer 60 between the portion of the semiconductor laser element 50 around the light reflecting surface 110b and the base 70 is also fused due to thermal conduction. Consequently, the thickness of the conductive bonding layer 60 varies with the warp of the semiconductor laser element 50, as shown in FIG. 3. In other words, the warp of the semiconductor laser element 50 is not corrected but the thickness of the conductive bonding layer 60 varies with the warp of the semiconductor laser element 50 according to the first embodiment. The collet 120 is provided with a hole 120a, and can adsorb the semiconductor laser element 50 by evacuating the hole 120a.

The conductive bonding layers 60 having a plurality of different thicknesses are arranged so as to correspond to the warp along arrow B of the semiconductor laser element 50 as shown in FIG. 8, whereby the thicknesses of the conductive bonding layers 60 after bonding can easily vary with the warp of the semiconductor laser element 50 as shown in FIG. 3. In this case, the semiconductor laser element 50 is preferably pressed on the upper portion of the conductive bonding layer 60 having the smallest (thinnest) thickness with the collet 120 as shown in FIG. 8. As shown in FIG. 3, the semiconductor laser element 50 is so fixed to the base 70 that the thickness of the conductive bonding layer 60 pressed with the collet 120 is rendered the smallest, the semiconductor laser element 50 can be easily fixed without correcting the warp.

The conductive bonding layer 61 (see FIG. 2) held between the seat portion 82 (see FIG. 2) heated to the high temperature along with the stem 80 (see FIG. 2) and the base 70 (see FIG. 2) is also fused by thermal conduction.

Thereafter the stem 80 is cooled for solidifying the conductive bonding layers 60 and 61 so that the semiconductor laser element 50 is fixed to the base 70 through the conductive bonding layer 60 and the base 70 is fixed to the seat portion 82 of the stem 80 through the conductive bonding layer 61, as shown in FIG. 2.

The wire bonding portion 115a of the semiconductor laser element 50 and the lead terminal 83 of the stem 80 are connected with each other by wire bonding through the Au wire 90, while the upper surface 70a of the base 70 and the seat portion 82 of the stem 80 are connected with each other by wire bonding through the Au wire 91. Finally, the windowed cap (not shown) transmitting the laser beam is mounted on the body portion 81 of the stem 80.

The semiconductor laser comprising the semiconductor laser device 40 according to the first embodiment is manufactured in the aforementioned manner.

According to the first embodiment, as hereinabove described, the semiconductor laser element 50 is so fixed to the base 70 that the distance between the convex side of the warp of the semiconductor laser element 50 and the base 70 varies with the warp of the semiconductor laser element 50 along the extensional direction (along arrow B) of the cavity, whereby the semiconductor laser element 50 can be fixed to the base 70 with no correction of the warp of the semiconductor laser element 50 itself even if the warp of the semiconductor laser element 50 is dispersed. Thus, the semiconductor laser element 50 can be prevented from excess stress resulting from correction of the warp. Therefore, deterioration of laser characteristics and breakage of the semiconductor laser element 50 (semiconductor laser element portion 110) can be suppressed.

According to the first embodiment, the semiconductor laser element 50 is provided with the wire bonding portion 115a on the portion of the p-side electrode 115 corresponding to the vicinity of the region (where the conductive bonding layer 60 substantially has the thickness H3 (see FIG. 3)) where the distance between the semiconductor laser element 50 and the base 70 is substantially the smallest. In other words, the wire bonding portion 115a is formed on a region corresponding to a region where the distance between the semiconductor laser element 50 and the base 70 is substantially the smallest on a cross section including the wire bonding portion 115a in the extensional direction (along arrow B). Thus, the wire bonding portion 115a provided on the region of the semiconductor laser element 50 minimally inclined with respect to the upper surface 70a of the base 70 is wire-bonded with the Au wire 90, whereby the semiconductor laser element 50 is prevented from application of excess stress in wire bonding dissimilarly to a case of wire-bonding a portion of the p-side electrode 115 corresponding to a largely inclined portion of the semiconductor laser element 50. Thus, deterioration of the laser characteristics and breakage of the semiconductor laser element 50 (semiconductor laser element portion 110) can be further suppressed.

According to the first embodiment, the semiconductor laser element 50 is fixed to the base 70 in view of the state of fixing of the larger warp along arrow B to the base 70 preferentially, and hence the wire bonding portion 115a provided on the region of the semiconductor laser element 50 minimally inclined with respect to the upper surface 70a of the base 70 can be easily wire-bonded.

According to the first embodiment, the semiconductor laser element 50 is so formed that the side provided with the substrate 100 is fixed to the base 70 through the conductive bonding layer 60 while the conductive bonding layer 60 is so formed that the thickness thereof varies with the warp of the semiconductor laser element 50 along the extensional direction (along arrow B) of the cavity on the region held between the substrate 100 of the semiconductor laser element 50 and the base 70 so that a clearance formed between the substrate 100 of the semiconductor laser element 50 and the base 70 to which the substrate 100 is fixed can be efficiently filled up with the conductive bonding layer 60 having the varying thickness in response to the warp of the semiconductor laser element 50, whereby the semiconductor laser element 50 can be easily fixed to the base 70 with no correction of the warp.

According to the first embodiment, the conductive bonding layer 60 for fixing the semiconductor laser element 50 to the base 70 is constituted of the fusible layer made of solder, whereby the fusible layer having the varying thickness can be easily formed due to the characteristic of fused solder.

According to the first embodiment, the semiconductor laser element 50 includes the semiconductor laser element portion 110 having the nitride-based semiconductor layers such as the n-type AlGaN clad layer 111, the active layer 112 of GaInN and the p-type AlGaN clad layer 113. Also when the semiconductor laser element portion 110 having the nitride-based semiconductor layers easily warped in epitaxial growth is fixed to the base 70, deterioration of the laser characteristics and breakage of the semiconductor laser element portion 110 resulting from correction of the warp can be easily suppressed due to the aforementioned structure according to the first embodiment.

According to the first embodiment, the wire bonding portion 115a is provided around the portion of the p-side electrode 115 corresponding to the vicinity of the region where the distance H3 between the semiconductor laser element 50 and the base 70 around the light emitting surface 110a of the cavity of the semiconductor laser element 50 is smaller than the distance H4 between the semiconductor laser element 50 and the base 70 around the light reflecting surface 110b of the cavity of the semiconductor laser device 50, whereby dispersion in the distance H3 between the semiconductor laser element 50 and the base 70 around the light emitting surface 110a of the cavity of the semiconductor laser element 50 is reduced as compared with a case where the distance H3 between the semiconductor laser element 50 and the base 70 is large around the light emitting surface 110a of the cavity of the semiconductor laser element 50. Thus, dispersion in the position of the laser beam emitted from the light emitting surface 110a of the cavity of the semiconductor laser element 50 is suppressed, and deterioration of the laser characteristics and breakage of the semiconductor laser element 50 are suppressed in the semiconductor laser device 40. Further, the lower surface of the semiconductor laser element 50 corresponding to the light emitting surface 110a can be substantially parallelly arranged on the upper surface 70a of the base 70, due to the aforementioned structure. Thus, the direction of the laser beam emitted from the light emitting surface 110a can be inhibited from upward inclination with respect to the surface 70a of the base 70. Consequently, the direction of the laser beam emitted from the semiconductor laser element 50 can be inhibited from dispersion, whereby the assembly yield of the semiconductor laser device 40 can be improved.

According to the first embodiment, the semiconductor laser element 50 is so arranged that the lower surface (provided with the n-side electrode 101) of the light emitting surface 110a of the cavity is substantially parallel to the upper surface 70a of the base 70 so that the wire bonding portion 115a provided around the light emitting surface 110a can be arranged substantially parallelly to the upper surface 70a of the base 70, whereby an impact load in wire bonding applied to the wire bonding portion 115a from above can be inhibited from biased application in the cross direction (along arrow C in FIG. 4) of the cavity of the semiconductor laser element 50.

According to the first embodiment, the ridge portion 113a is provided on the upper surface of the semiconductor laser element 50 to extend substantially parallelly to the centerline 500 (shown by the one-dot chain line in FIG. 4) in the cross direction (along arrow C in FIG. 4) of the cavity along the extensional direction (along arrow B) of the cavity at the prescribed distance (about 20 µm) from the centerline 500 and to be connected to the p-side electrode 115 through the ohmic layer 116 while the wire bonding portion 115a is provided on the upper surface of the insulating film 114 (see FIG. 5) in the region provided with no ridge portion 113a so that neither the ridge portion 113a nor the ohmic layer 116 is arranged immediately under the wire bonding portion 115a, whereby the impact load applied to the wire bonding portion 115a from above in wire bonding is not directly applied to the ridge portion 113a and the ohmic layer 116. Thus, the ridge portion 113a and the ohmic layer 116 can be protected against the impact load in wire bonding.

According to the first embodiment, the ridge portion 113a and the wire bonding portion 115a are formed in the directions opposite to each other through the substantially central portion (around the centerline 500) of the semiconductor laser element 50 in the cross direction (along arrow C in FIG. 4) of the cavity, whereby the wire bonding portion 115a can be further approached to the centerline 500 than the ridge portion 113a deviating from the centerline 500 toward one side along arrow C. Thus, the impact load applied to the wire bonding portion 115a from above in wire bonding can be inhibited from biased application in the cross direction (along arrow C in FIG. 4) of the cavity of the semiconductor laser element 50.

According to the first embodiment, the wire bonding portion 115a is so formed as to protrude from the p-side electrode 115 in the cross direction (along arrow C) of the cavity in plan view, whereby the ridge portion 113a and the ohmic layer 116 under the p-side electrode 115 can be easily protected against the impact load in wire bonding.

Second Embodiment

Figure 9:
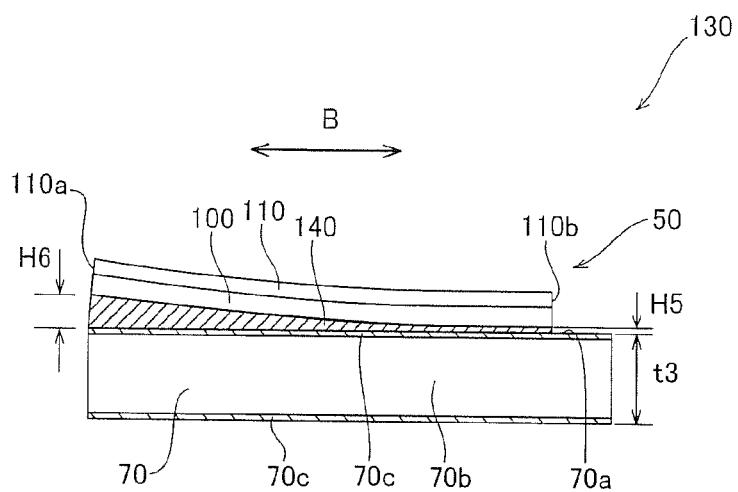
FIG. 9 is a sectional view showing the structure of a semiconductor laser device according to a second embodiment of the present invention.
Figure 10:
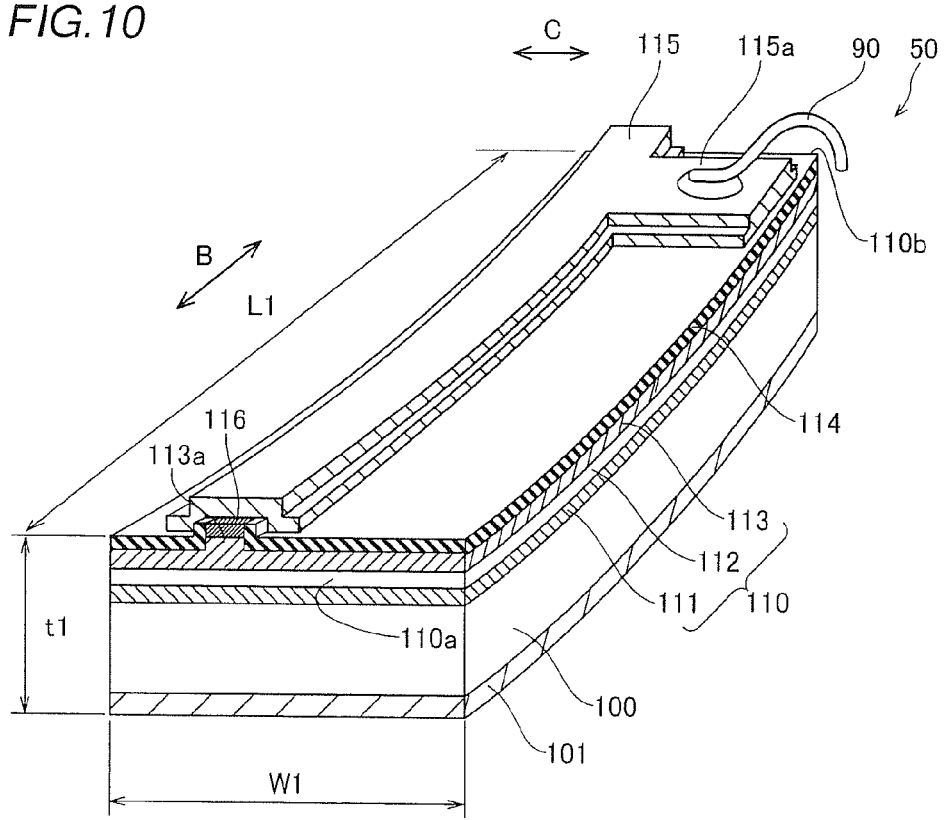
FIG. 10 is a perspective view showing the structure of the semiconductor laser device according to the second embodiment of the present invention.
Figure 11:
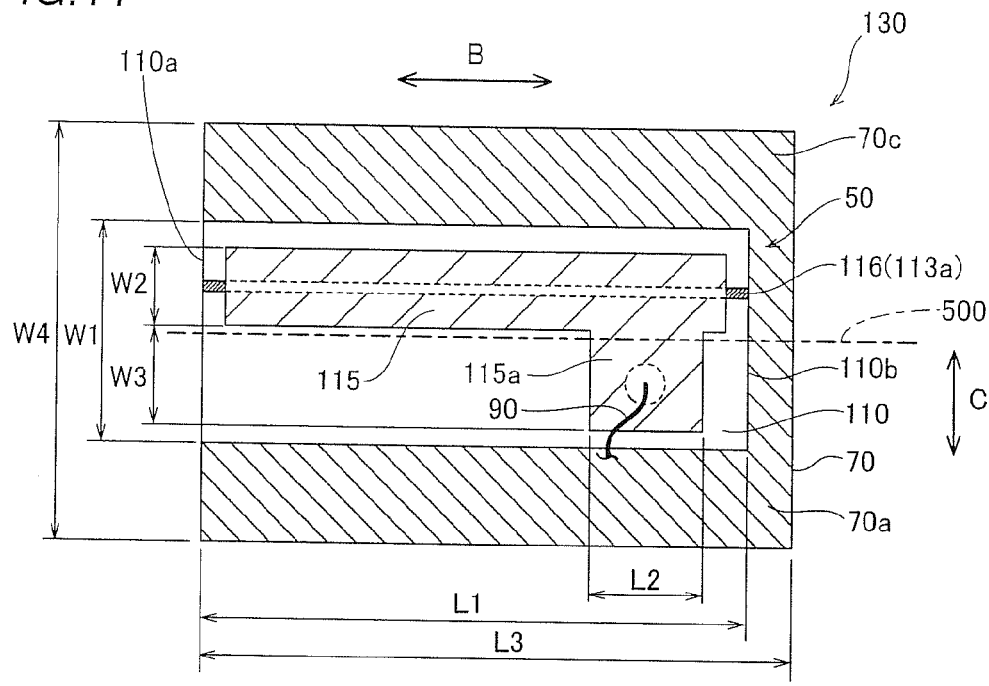
FIG. 11 is a plan view showing the structure of the semiconductor laser device according to the second embodiment of the present invention shown in FIG. 9.

Referring to FIGS. 9 to 11, a semiconductor laser element 50 is so fixed to a base 70 that the distance between the semiconductor laser element 50 and the base 70 around a light reflecting surface 110b of a cavity is smaller than the distance between the semiconductor laser element 50 and the base 70 around a light emitting surface 110a of the cavity in a semiconductor laser device 130 according to a second embodiment of the present invention, dissimilarly to the aforementioned first embodiment.

In the semiconductor laser device 130 according to the second embodiment, the semiconductor laser element 50 is so fixed to the base 70 through a conductive bonding layer 140 (see FIG. 9) of AuSn or the like that the distance between the convex side (provided with a substrate 100) of a warp of the semiconductor laser element 50 and the base 70 changes along the extensional direction (along arrow B) of the cavity similarly to the aforementioned first embodiment, as shown in FIGS. 9 and 10.

According to the second embodiment, the conductive bonding layer 140 of AuSn or the like is so formed that the distance (thickness of the conductive bonding layer 140) H5 between the semiconductor laser element 50 and the base 70 around the light reflecting surface 110b of the cavity of the semiconductor laser element 50 is smaller than the distance (thickness of the conductive bonding layer 140) H6 between the semiconductor laser element 50 and the base 70 around the light emitting surface 110a of the cavity of the semiconductor laser element 50 for fixing the side of the semiconductor laser element 50 provided with the substrate 100 to the base 70 through the conductive bonding layer 140, as shown in FIG. 9.

As shown in FIG. 9, the light reflecting surface 110b of the semiconductor laser element 50 is arranged substantially parallelly to the upper surface 70a of the base 70. In other words, the semiconductor laser element 50 is so arranged that the direction of a laser beam reflected on the light reflecting surface 110b is substantially parallel to the extensional direction of the upper surface 70a of the base 70.

According to the second embodiment, a wire bonding portion 115a provided on a p-side electrode 115 of the semiconductor laser element 50 is so arranged as to correspond to the vicinity of the light reflecting surface 110b, as shown in FIGS. 10 and 11. In other words, the wire bonding portion 115a is provided on a portion of the p-side electrode 115 corresponding to the vicinity of a region (where the conductive bonding layer 140 substantially has the thickness H5 (see FIG. 9)) where the distance between the semiconductor laser element 50 and the base 70 is substantially the smallest.

According to the second embodiment, a ridge portion 113a and the p-side electrode 115 of the semiconductor laser element 50 are provided on the upper surface of a semiconductor laser element portion 110 to extend substantially parallelly to a centerline 500 (shown by a one-dot chain line) (see FIG. 11) of the cavity of the semiconductor laser element 50 in the cross direction (along arrow C) at a prescribed distance (about 20 μm) from the centerline 500, as shown in FIGS. 10 and 11. The wire bonding portion 115a protrudes from the p-side electrode 115 formed immediately above the ridge portion 113a through an ohmic layer 116 in the direction C of the semiconductor laser element 50, and is provided on the upper surface of an insulating film 114 in a region provided with no ridge portion 113b across the centerline 500 (see FIG. 11).

The remaining structure of the semiconductor laser device 130 according to the second embodiment is similar to that of the aforementioned first embodiment.

A manufacturing process for a semiconductor laser comprising the semiconductor laser device 130 according to the second embodiment is now described with reference to FIGS. 2 and 9 to 12.

First, the semiconductor laser element 50 is formed similarly to the aforementioned first embodiment.

According to the second embodiment, the convex side (provided with the substrate 100) of the warp of the semiconductor laser element 50 is so die-bonded to the base 70 that the distance (thickness of the conductive bonding layer 140) H5 between the semiconductor laser element 50 and the base 70 around the light reflecting surface 110b of the cavity of the semiconductor laser element 50 is smaller than the distance (thickness of the conductive bonding layer 140) H6 between the semiconductor laser element 50 and the base 70 around the light emitting surface 110a of the cavity of the semiconductor laser element 50, as shown in FIG. 9. At the same time, the base 70 is fixed to a seat portion 82 (see FIG. 2) of a stem 80.

Figure 12:
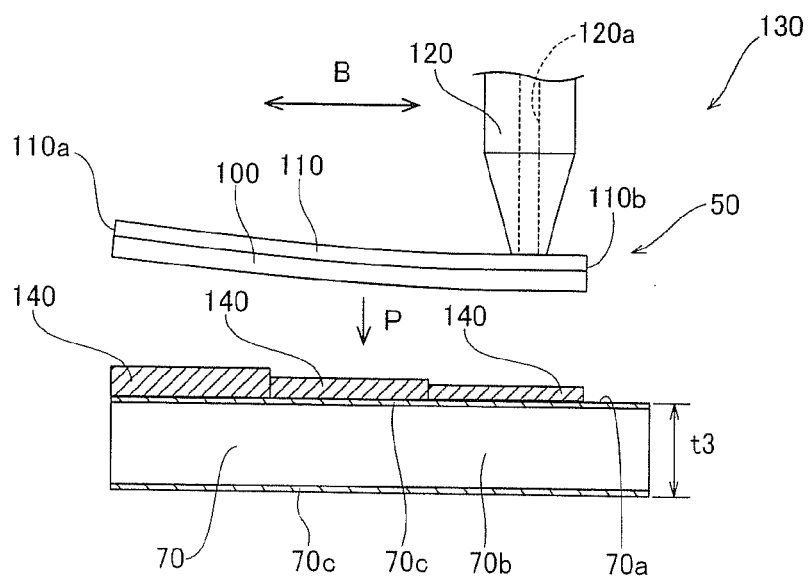
FIG. 12 is a diagram for illustrating a manufacturing process for a semiconductor laser comprising the semiconductor laser device according to the second embodiment of the present invention.

According to the second embodiment, the conductive bonding layer 140 is so arranged on the upper surface 70a of the base 70 that the thickness thereof changes in three ways (three stages) in the longitudinal direction (along arrow B) of the cavity, as shown in FIG. 12. In other words, the conductive bonding layer 140 of solder is so arranged on the upper surface 70a of the base 70 that the thickness thereof increases stepwise from around the light reflecting surface 110b toward the light emitting surface 110a.

The convex side (provided with the substrate 100) of the warp of the semiconductor laser element 50 is die-bonded to the base 70 similarly to the aforementioned first embodiment, as shown in FIG. 12. When a portion of the semiconductor laser element 50 around the light reflecting surface 110b is pressed with a collet 120 along arrow P, the region (around the light reflecting surface 110b of the semiconductor laser element 50) of the conductive bonding layer 140 pressed with the collet 120 is fused to move to another region (around the light emitting surface 110a of the semiconductor laser element 50) not pressed with the collet 120, while the region of the conductive bonding layer 140 between the portion of the semiconductor laser element 50 around the light emitting surface 110a and the base 70 is also fused due to thermal conduction. Consequently, the thickness of the conductive bonding layer 140 varies with the warp of the semiconductor laser element 50, as shown in FIG. 9. In other words, the warp of the semiconductor laser element 50 is not corrected but the thickness of the conductive bonding layer 140 varies with the warp of the semiconductor laser element 50 for fixing the semiconductor laser element 50 to the base 70 also in the second embodiment.

The remaining manufacturing process for the semiconductor laser comprising the semiconductor laser device 130 according to the second embodiment is similar to that of the aforementioned first embodiment. The semiconductor laser comprising the semiconductor laser device 130 according to the second embodiment is manufactured in the aforementioned manner.

According to the second embodiment, as hereinabove described, the wire bonding portion 115a is provided around the light reflecting surface 110b of the cavity of the semiconductor laser element 50, whereby heat generated from the light reflecting surface 110b partially absorbing the laser beam when reflecting the laser beam in the cavity can be efficiently diffused (radiated) through the conductive bonding layer 140 and the wire bonding portion 115a positioned on the region (where the conductive bonding layer 140 substantially has the thickness H5 (see FIG. 9)) where the distance between the semiconductor laser element 50 and the base 70 is substantially the smallest.

According to the second embodiment, the wire bonding portion 115a is provided around the portion of the p-side electrode 115 corresponding to the vicinity of the region where the distance H5 between the semiconductor laser element 50 and the base 70 around the light reflecting surface 110b of the cavity of the semiconductor laser element 50 is smaller than the distance H6 between the semiconductor laser element 50 and the base 70 around the light emitting surface 110a of the cavity of the semiconductor laser element 50, whereby it is possible to recognize that the wire bonding portion 115a is provided on a position around the light reflecting surface 110b of the cavity by planarly observing the formed semiconductor laser element 50. Thus, the direction (position of the light emitting surface 110a) of the laser beam emitted from the semiconductor laser element 50 can be easily identified.

According to the second embodiment, the semiconductor laser element 50 is so arranged that the lower surface (provided with an n-side electrode 101) of the light reflecting surface 110b of the cavity is substantially parallel to the upper surface 70a of the base 70 so that the wire bonding portion 115a provided around the light reflecting surface 110b can be arranged substantially parallelly to the upper surface 70a of the base 70, whereby an impact load in wire bonding applied to the wire bonding portion 115a from above can be inhibited from biased application in the cross direction (along arrow C in FIG. 11) of the cavity of the semiconductor laser element 50.

Also according to the second embodiment, the p-side electrode 115 and the ridge portion 113a are formed on the upper surface of the semiconductor laser element portion 110 to extend substantially parallelly to the centerline 500 (shown by the one-dot chain line in FIG. 11) in the cross direction (along arrow C in FIG. 11) of the cavity along the extensional direction (along arrow B in FIG. 11) of the cavity at the prescribed distance (about 20 μm) from the centerline 500 while the wire bonding portion 115a is arranged on the upper surface of the insulating film 114 (see FIG. 5) in the region provided with no ridge portion 113a so that neither the ridge portion 113a nor the ohmic layer 116 is arranged immediately under the wire bonding portion 115a, whereby the impact load applied to the wire bonding portion 115a from above in wire bonding is not directly applied to the ridge portion 113a and the ohmic layer 116. Thus, the ridge portion 113a and the ohmic layer 116 can be protected against the impact load in wire bonding.

The remaining effects of the second embodiment are similar to those of the aforementioned first embodiment.

Third Embodiment

Figure 13:
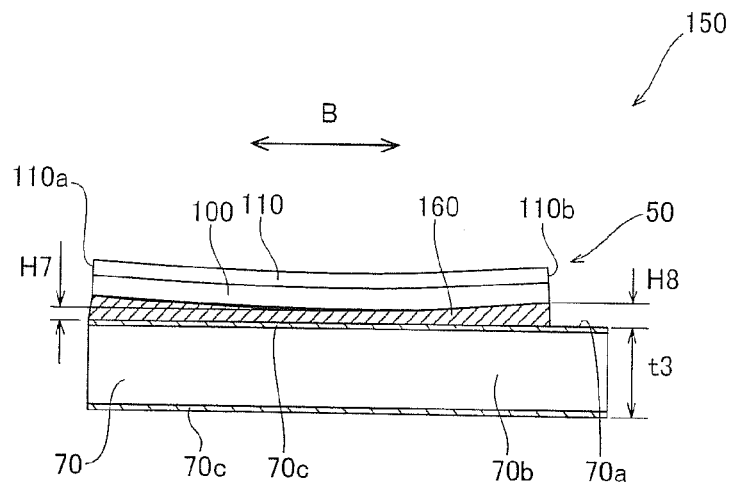
FIG. 13 is a sectional view showing the structure of a semiconductor laser device according to a third embodiment of the present invention.
Figure 14:
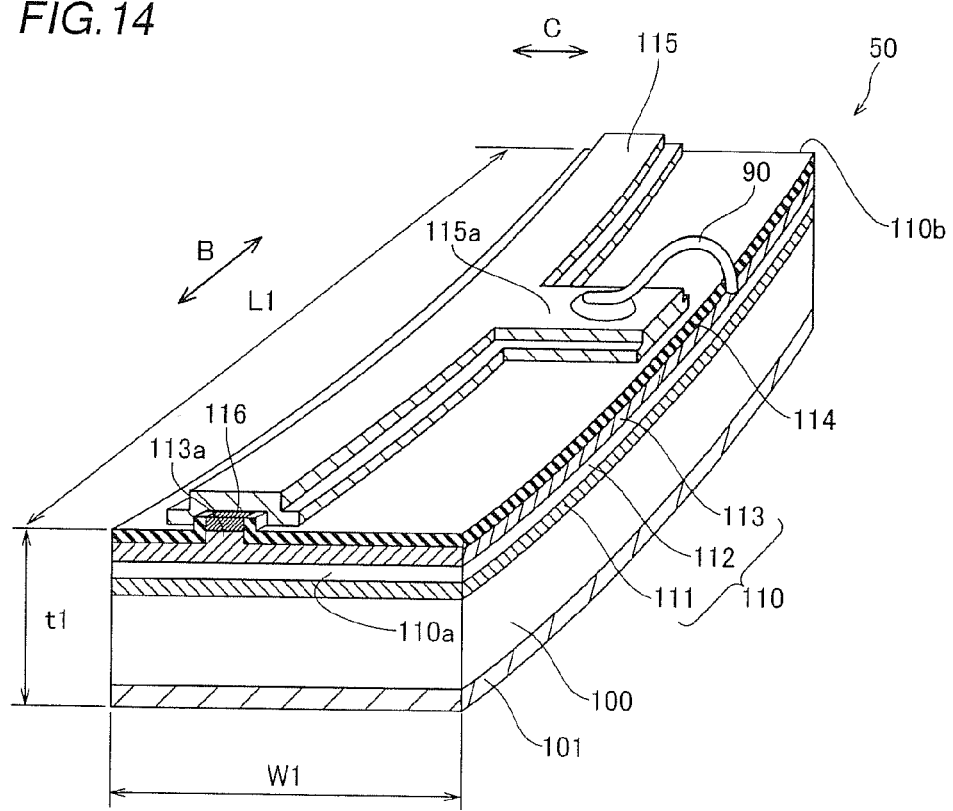
FIG. 14 is a perspective view showing the structure of the semiconductor laser device according to the third embodiment of the present invention.
Figure 15:
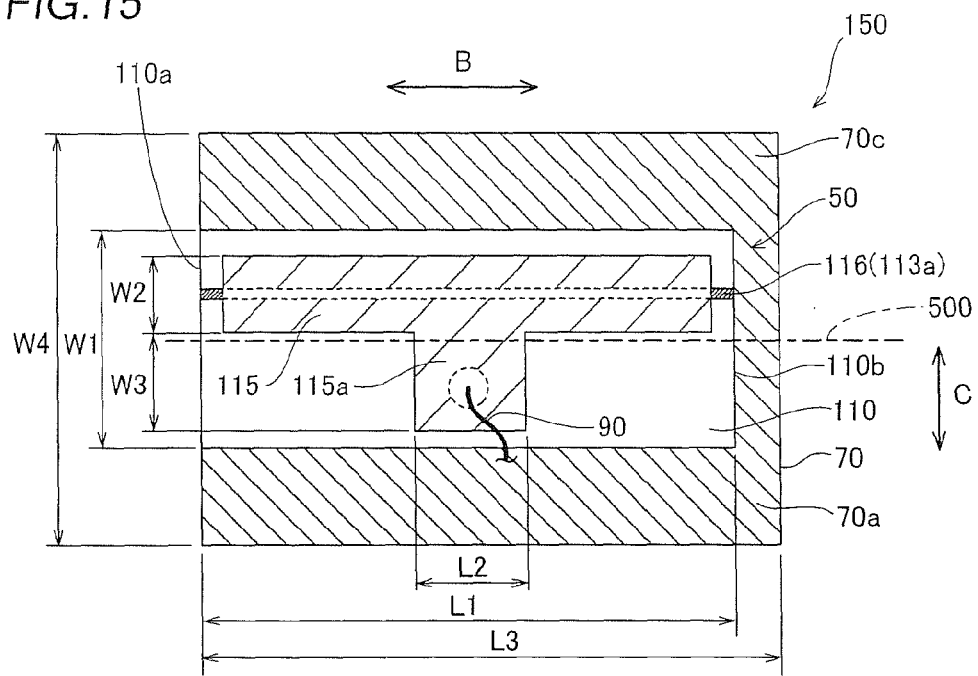
FIG. 15 is a plan showing the structure of the semiconductor laser device according to the third embodiment of the present invention shown in FIG. 13.

Referring to FIGS. 13 to 15, a semiconductor laser element 50 is so fixed to a base 70 that the distance between the semiconductor laser element 50 and the base 70 around the center of a cavity is smaller than the distance between the semiconductor laser element 50 and the base 70 around a light reflecting surface 110b and a light emitting surface 110a of the cavity in a semiconductor laser device 150 according to a third embodiment of the present invention, dissimilarly to the aforementioned first embodiment.

In the semiconductor laser device 150 according to the third embodiment, the semiconductor laser element 50 is so fixed to the base 70 through a conductive bonding layer 160 (see FIG. 13) of AuSn or the like that the distance between the convex side (provided with a substrate 100) of a warp of the semiconductor laser element 50 and the base 70 changes along the extensional direction (along arrow B) of the cavity similarly to the aforementioned first and second embodiments, as shown in FIGS. 13 and 14.

According to the third embodiment, the conductive bonding layer 160 of AuSn or the like is so formed that the distance (thickness of the conductive bonding layer 160) H7 between the semiconductor laser element 50 and the base 70 around the center of the cavity is smaller than the distance (thickness of the conductive bonding layer 160) H7 between the semiconductor laser element 50 and the base 70 around the light reflecting surface 110b of the cavity and around the light emitting surface 110a of the cavity for fixing the side of the semiconductor laser element 50 provided with the substrate 100 to the base 70 through the conductive bonding layer 160, as shown in FIG. 13.

As shown in FIG. 13, the portion of the semiconductor laser element 50 around the center of the cavity is arranged substantially parallelly to the upper surface 70a of the base 70. In other words, the semiconductor laser element 50 is so arranged that the direction of a laser beam transmitted around the center of the cavity is substantially parallel to the extensional direction of the upper surface 70a of the base 70.

According to the third embodiment, a wire bonding portion 115a provided on a p-side electrode 115 of the semiconductor laser element 50 is so arranged as to correspond to the portion around the center of the cavity, as shown in FIGS. 14 and 15. In other words, the wire bonding portion 115a is provided on a portion of the p-side electrode 115 corresponding to the vicinity of a region (where the conductive bonding layer 160 substantially has the thickness H7 (see FIG. 13)) where the distance between the semiconductor laser element 50 and the base 70 is substantially the smallest.

According to the third embodiment, a ridge portion 113a and the p-side electrode 115 of the semiconductor laser element 50 are so formed on the upper surface of the semiconductor laser element portion 110 as to extend substantially parallelly to a centerline 500 (shown by a one-dot chain line) (see FIG. 15) of the cavity of the semiconductor laser element 50 in the cross direction (along arrow C) at a prescribed distance (about 20 μm) from the centerline 500, as shown in FIGS. 14 and 15. The wire bonding portion 115a protrudes from the p-side electrode 115 formed immediately above the ridge portion 113a through an ohmic layer 116 in the direction C of the semiconductor laser element 50, and is arranged on the upper surface of an insulating film 114 in a region provided with no ridge portion 113b across the centerline 500 (see FIG. 15).

The remaining structure of the semiconductor laser device 150 according to the third embodiment is similar to those of the aforementioned first and second embodiments.

A manufacturing process for a semiconductor laser comprising the semiconductor laser device 150 according to the third embodiment is described with reference to FIGS. 2 and 13 to 16.

First, the semiconductor laser element 50 is formed similarly to the aforementioned first and second embodiments.

According to the third embodiment, the convex side (provided with the substrate 100) of the warp of the semiconductor laser element 50 is so die-bonded to the base 70 that the distance (thickness of the conductive bonding layer 160) H7 between the semiconductor laser element 50 and the base 70 around the center of the cavity of the semiconductor laser element 50 is smaller than the distance (thickness of the conductive bonding layer 160) H8 between the semiconductor laser element 50 and the base 70 around the light reflecting surface 110b of the cavity and around the light emitting surface 110a of the cavity, as shown in FIG. 13. At the same time, the base 70 is fixed to a seat portion 82 (see FIG. 2) of a stem 80.

Figure 16:
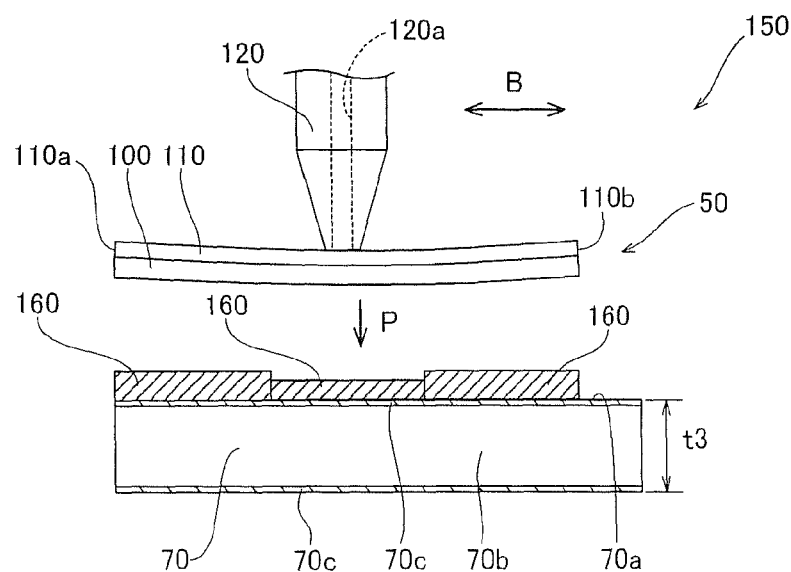
FIG. 16 is a diagram illustrating a manufacturing process for a semiconductor laser comprising the semiconductor laser device according to the third embodiment of the present invention.

According to the third embodiment, the conductive bonding layer 160 is so arranged on the upper surface 70a of the base 70 that the thickness thereof changes in two ways (two stages) in the longitudinal direction (along arrow B) of the cavity, as shown in FIG. 16. In other words, the conductive bonding layer 160 of solder is so arranged on the upper surface 70a of the base 70 that the thickness thereof increases stepwise from around the center of the cavity toward the light reflecting surface 110b and the light emitting surface 110a.

As shown in FIG. 16, the convex side (provided with the substrate 100) of the warp of the semiconductor laser element 50 is die-bonded to the base 70, similarly to the aforementioned first and second embodiments. When the portion of the semiconductor laser element 50 around the center of the cavity is pressed with a collet 120 along arrow P, the region (around the center of the cavity of the semiconductor laser element 50) pressed with the collet 120 is fused to move to other regions (around the light emitting surface 110a and around the light reflecting surface 110b) not pressed with the collet 120 while the regions of the conductive bonding layer 160 between the portions of the semiconductor laser element 50 around the light emitting surface 110a and around the light reflecting surface 110b and the base 70 are also fused due to thermal conduction. Consequently, the thickness of the conductive bonding layer 160 varies with the warp of the semiconductor laser element 50, as shown in FIG. 13. In other words, the warp of the semiconductor laser element 50 is not corrected but the thickness of the conductive bonding layer 160 varies with the warp of the semiconductor laser element 50 for fixing the semiconductor laser element 50 to the base 70 also in the third embodiment.

According to the third embodiment, an Au wire 90 (see FIG. 2) is wire-bonded to the wire bonding portion 115a (see FIG. 15) arranged around the center of the cavity substantially parallelly to the upper surface 70a of the base 70 (see FIG. 13), from immediately above the wire bonding portion 115a.

The remaining manufacturing process for the semiconductor laser comprising the semiconductor laser device 150 according to the third embodiment is similar to those of the aforementioned first and second embodiments. The semiconductor laser comprising the semiconductor laser device 150 according to the third embodiment is manufactured in the aforementioned manner.

According to the third embodiment, as hereinabove described, the wire bonding portion 115a is provided around the center of the cavity of the semiconductor laser element 50 so that the Au wire 90 (see FIG. 2) is wire-bonded to the wire bonding portion 115a from immediately above the wire bonding portion 115a (see FIG. 15) substantially parallel to the upper surface 70a of the base 70 (see FIG. 13) in the manufacturing process for the semiconductor laser comprising the semiconductor laser device 150, whereby the p-side electrode 115 can be reliably wire-bonded.

The remaining effects of the third embodiment are similar to those of the aforementioned first and second embodiments.

Fourth Embodiment

Figure 17:
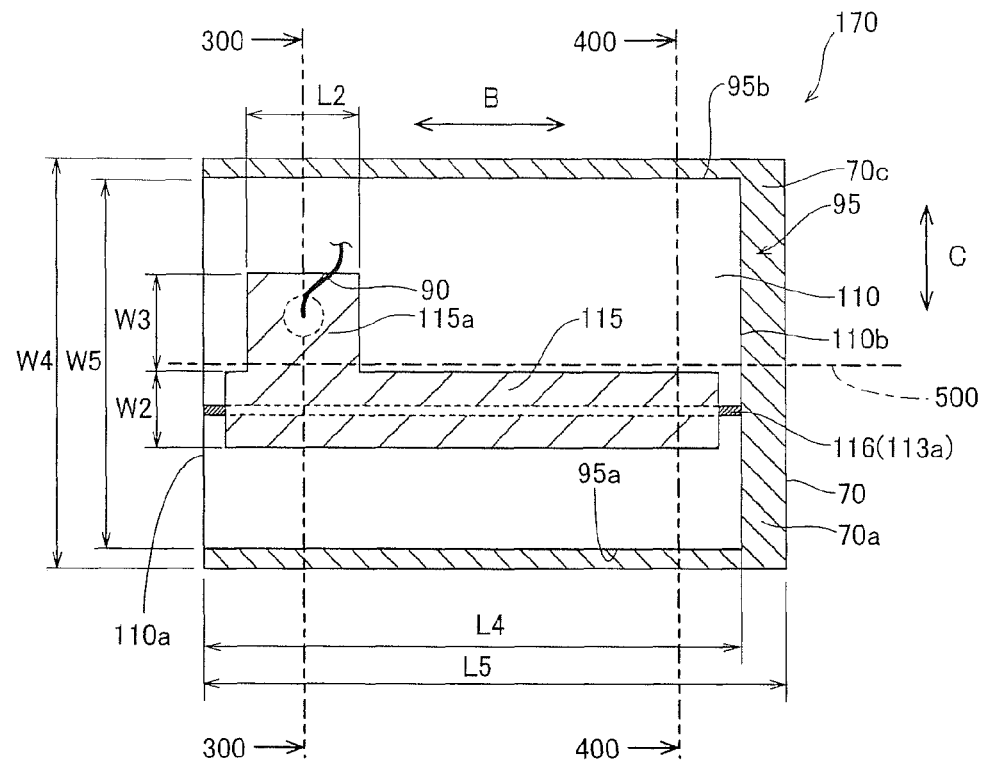
FIG. 17 is a plan view showing the structure of a semiconductor laser device according to a fourth embodiment of the present invention.
Figure 18:
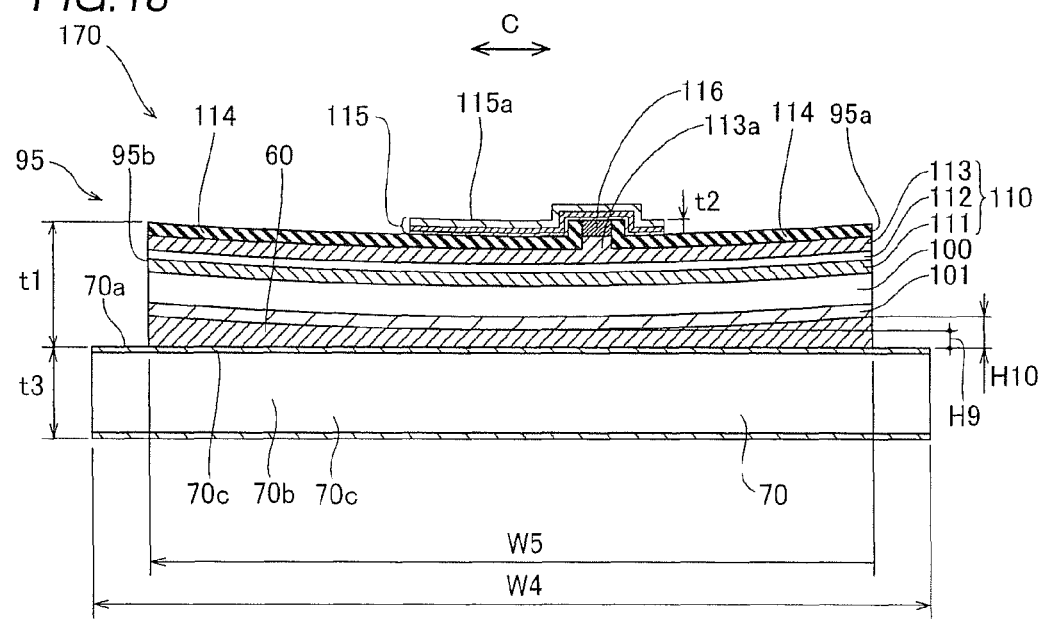
FIG. 18 is a sectional view showing the structure of the semiconductor laser device according to the fourth embodiment of the present invention shown in FIG. 17.

Referring to FIGS. 3, 17 and 18, a semiconductor laser element 95 warped not only in the extensional direction (along arrow B) of a cavity but also in the cross direction thereof (along arrow C: perpendicular to the extensional direction of the cavity) is fixed to a base 70 in a semiconductor laser device 170 according to a fourth embodiment of the present invention, dissimilarly to the aforementioned first embodiment. FIG. 18 is a sectional view of the semiconductor laser device 170 taken along the line 300-300 in FIG. 17.

In a semiconductor laser comprising the semiconductor laser device 170 according to the fourth embodiment, the semiconductor laser element 95 is fixed to the base 70 through a conductive bonding layer 60 (see FIG. 18) of AuSn or the like, as shown in FIGS. 17 and 18. The semiconductor laser element 95 has a width (W5) of about 800 μm, a length (L4) of about 900 μm and a thickness (t1) of about 100 μm. The base 70 has a width (W4) of about 900 μm, a length (L5) of about 1000 μm and a thickness (t3) of about 250 μm. The sectional shape of the semiconductor laser element 95 along the extensional direction (along arrow B) of the cavity is similar to the sectional shape of the semiconductor laser element 50 shown in FIG. 3.

According to the fourth embodiment, the semiconductor laser element 95 has the warp also along the cross direction (along arrow C) of the cavity in addition to the extensional direction (along arrow B) of the cavity, as shown in FIG. 18. Therefore, the semiconductor laser element 95 is so warped that an upper surface (first main surface) is concaved and a lower surface (second main surface) is convexed and hence the surface of a semiconductor laser element portion 110 opposite to a substrate 100 is concaved also in the cross direction (along arrow C) of the cavity. Thus, the convex side (provided with the substrate 100) of the warp of the semiconductor laser element 95 along arrows B and C is fixed to the base 70. The warp along arrow C of the semiconductor laser element 95 is smaller than the warp along arrow B. In the semiconductor laser device 95, the convex side (provided with the substrate 100) of the warp is preferably fixed to the base 70 while giving priority to the shape of the larger warp along arrow B.

According to the fourth embodiment, the distance (thickness of the conductive bonding layer 60) H9 between the semiconductor laser element 95 and the base 70 around the center of the semiconductor laser element 95 in the direction (along arrow C) along a cavity facet (a light emitting surface 110a or a light reflecting surface 110b) is smaller than the distance (thickness of the conductive bonding layer 60) H10 between the semiconductor laser element 95 and the base 70 around ends 95a and 95b of the semiconductor laser element 95 in the direction (along arrow C) along the cavity facet, as shown in FIG. 18.

According to the fourth embodiment, a wire bonding portion 115a provided on a p-side electrode 115 of the semiconductor laser element 95 is arranged on the upper surface of an insulating film 114 around the light emitting surface 110a, as shown in FIG. 17. In other words, the wire bonding portion 115a is provided on a portion of the p-side electrode 115 corresponding to the vicinity of a region (where the conductive bonding layer 60 substantially has a thickness H3 (see FIG. 3) and the thickness H9 (see FIG. 18)) where the distance between the semiconductor laser element 95 and the base 70 is substantially the smallest along arrows B and C.

According to the fourth embodiment, a ridge portion 113a and the p-side electrode 115 of the semiconductor laser element 95 are so formed as to extend substantially parallelly to a centerline 500 (shown by a one-dot chain line) of the semiconductor laser element 95 in the cross direction (along arrow C) of the cavity at a prescribed distance (about 20 μm) from the centerline 500, as shown in FIG. 17. The wire bonding portion 115a protrudes from the p-side electrode 115 formed immediately above the ridge portion 113a through an ohmic layer 116 in the cross direction (along arrow C) of the semiconductor laser element 95, and is arranged on the upper surface of the insulating film 114 in the region provided with no ridge portion 113b across the centerline 500.

The remaining structure the semiconductor laser device 170 according to the fourth embodiment and a manufacturing process for a semiconductor laser comprising the semiconductor laser device 170 are similar to those of the aforementioned first embodiment.

According to the fourth embodiment, as hereinabove described, the semiconductor laser element 95 is so fixed to the base 70 that the distance between the convex side of the warp of the semiconductor laser element 95 and the base 70 varies with the warp of the semiconductor laser element 95 along the extensional direction (along arrow B) of the cavity and the cross direction (along arrow C) of the cavity, whereby the semiconductor laser element 95 can be fixed to the base 70 with no correction of the warp of the semiconductor laser element 95 itself even if the warp of the semiconductor laser element 95 is dispersed not only in the direction B but also in the direction C. Thus, the semiconductor laser element 95 can be prevented from excess stress resulting from correction of the warp. Therefore, deterioration of laser characteristics and breakage of the semiconductor laser element 95 (semiconductor laser element portion 110) can be suppressed.

According to the fourth embodiment, the wire bonding portion 115a is provided on the portion of the p-side electrode 115 corresponding to the vicinity of the region (where the conductive bonding layer 60 substantially has the thickness H3 (see FIG. 3) and the thickness H9 (see FIG. 18)) where the distance between the convex side of the warp of the semiconductor laser element 95 and the base 70 is substantially the smallest along arrow C so that the wire bonding portion 115a provided on the region of the semiconductor laser element 95 minimally inclined with respect to the upper surface 70a of the base 70 (around the center along arrow C) not only in the direction B but also in the direction C, whereby the semiconductor laser element 95 is prevented from application of excess stress in wire bonding dissimilarly to a case of wire-bonding a portion of the p-side electrode 115 corresponding to a largely inclined portion of the semiconductor laser element 95. Thus, deterioration of the laser characteristics and breakage of the semiconductor laser element 95 (semiconductor laser element portion 110) can be further suppressed.

The aforementioned effects are obtained also when the warp along arrow C is larger than the warp along arrow B (cavity direction) in the semiconductor laser element 95 and hence the wire bonding portion 115a is provided around a portion of the p-side electrode 115 corresponding to a portion where the thickness of the conductive bonding layer 60 having the larger warp along arrow B is the smallest. In other words, the wire bonding portion 115a may be formed on a region corresponding to a region where the distance between the semiconductor laser element 95 and the base 70 is substantially the smallest on a cross section including the wire bonding portion 115a along a third direction (along arrow B in the fourth embodiment), when the semiconductor laser element 95 has warps along the third direction and a fourth direction (along arrow C in the fourth embodiment) intersecting with each other and the warp along the third direction is larger than the warp along the fourth direction.

According to the fourth embodiment, the ridge portion 113a and the wire bonding portion 115a are formed in the directions opposite to each other through the substantially central portion (around the centerline 500) of the semiconductor laser element 95 in the cross direction (along arrow C) of the cavity, whereby the wire bonding portion 115a can be further approached to the centerline 500 than the ridge portion 113a deviating from the centerline 500 toward one side along arrow C. Thus, the wire bonding portion 115a provided on the region of the semiconductor laser element 95 minimally inclined with respect to the upper surface 70a of the base 70 in the direction C can be wire-bonded. Further, an impact load applied to the wire bonding portion 115a from above in wire bonding can be inhibited from biased application in the cross direction (along arrow C) of the cavity of the semiconductor laser element 95. The remaining effects of the fourth embodiment are similar to those of the aforementioned first embodiment.

Fifth Embodiment

Figure 19:
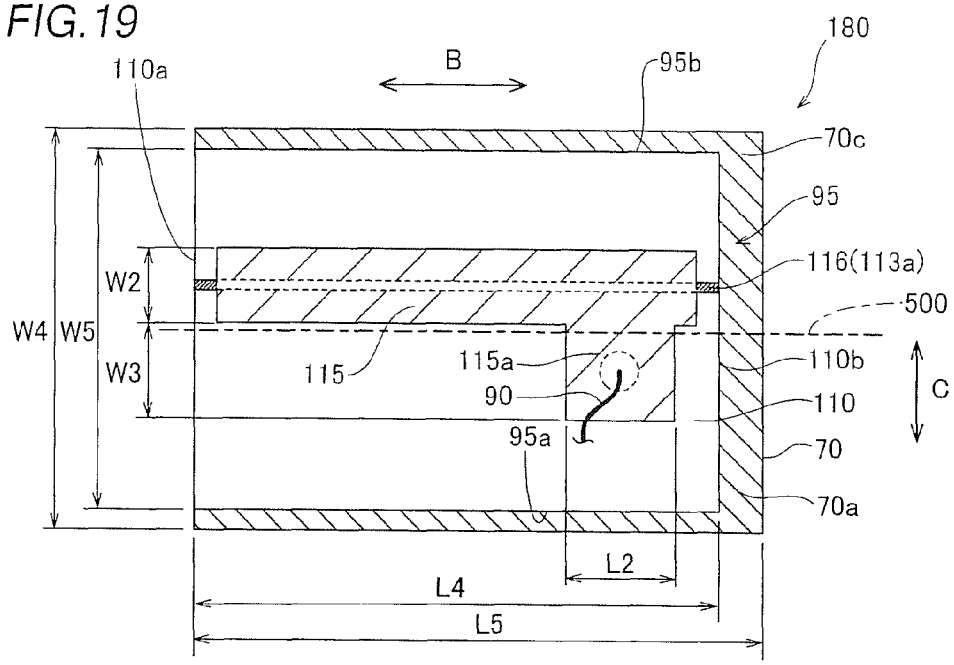
FIG. 19 is a plan view showing the structure of a semiconductor laser device according to a fifth embodiment of the present invention.

Referring to FIGS. 9, 18 and 19, a semiconductor laser element 95 is so fixed to a base 70 that the distance between the semiconductor laser element 95 and the base 70 around a light reflecting surface 110b of a cavity is smaller than the distance between the semiconductor laser element 95 and the base 70 around a light emitting surface 110a of the cavity in a semiconductor laser device 180 according to a fifth embodiment of the present invention, dissimilarly to the aforementioned fourth embodiment.

In the semiconductor laser device 180 according to the fifth embodiment, the semiconductor laser element 95 is fixed to the base 70 through a conductive bonding layer 60 so formed that the distance (corresponding to the distance H5 shown in FIG. 9) between the semiconductor laser element 95 and the base 70 around the light reflecting surface 110b of the cavity is smaller than the distance (corresponding to the distance H6 shown in FIG. 9) between the semiconductor laser element 95 and the base 70 around the light emitting surface 110a of the cavity, similarly to the sectional shape of the semiconductor laser element 50 along arrow B shown in FIG. 9. In the semiconductor laser element 95, the warp along arrow B (cavity direction) is larger than the warp along arrow C similarly to the aforementioned fourth embodiment. Therefore, in the semiconductor laser device 95, the convex side (provided with the substrate 100) of the warp is preferably fixed to the base 70 while giving priority to the shape of the larger warp along arrow B as the shape shown in FIG. 9.

According to the fifth embodiment, the distance (corresponding to the distance H9 shown in FIG. 18) between the semiconductor laser element 95 and the base 70 around the center of the semiconductor laser element 95 in the direction (along arrow C) along a cavity facet (the light emitting surface 110a or the light reflecting surface 110b) is smaller than the distance (corresponding to the distance H10 shown in FIG. 18) between the semiconductor laser element 95 and the base 70 around ends 95a and 95b of the semiconductor laser element 95 in the direction (along arrow C) along the cavity facet, similarly to the sectional shape of the semiconductor laser element 95 along arrow C shown in FIG. 18. In the semiconductor laser element 95, the warp along arrow B is larger than the warp along arrow C, and hence the wire bonding portion 115a is preferably provided around a portion of the p-side electrode 115 corresponding to a portion where the thickness of the conductive bonding layer 60 having the larger warp along arrow B is the smallest.

According to the fifth embodiment, a wire bonding portion 115a provided on a p-side electrode 115 of the semiconductor laser element 95 is arranged on the upper surface of an insulating film 114 around the light reflecting surface 110b, as shown in FIG. 19. In other words, the wire bonding portion 115a is provided on a portion of the p-side electrode 115 corresponding to the vicinity of a region (where the conductive bonding layer 60 substantially has the thickness H5 (see FIG. 9) and the thickness H9 (see FIG. 18)) where the distance between the semiconductor laser element 95 and the base 70 is substantially the smallest.

The remaining structure of the semiconductor laser device 180 according to the fifth embodiment and a manufacturing process for a semiconductor laser comprising the semiconductor laser device 180 are similar to those of the aforemen-

Sixth Embodiment

Figure 20:
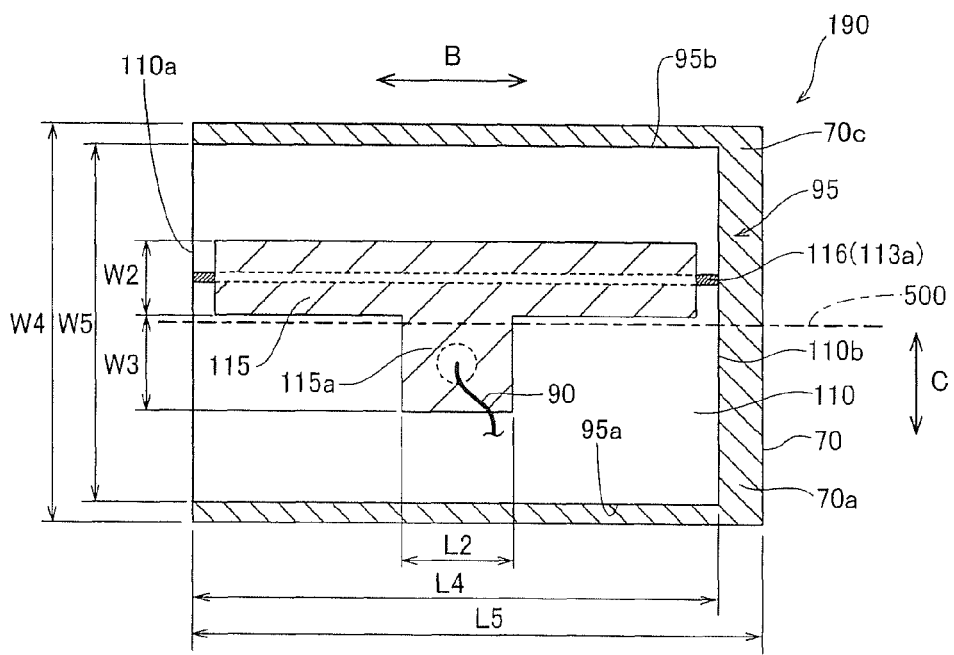
FIG. 20 is a plan view showing the structure of a semiconductor laser device according to a sixth embodiment of the present invention.

Referring to FIGS. 13, 18 and 20, a semiconductor laser element 95 is so fixed to a base 70 that the distance between the semiconductor laser element 95 and the base 70 around the center of a cavity is smaller than the distance between the semiconductor laser element 95 and the base 70 around a light reflecting surface 110b and around a light emitting surface 110a of the cavity in a semiconductor laser device 190 according to a sixth embodiment of the present invention, dissimilarly to the aforementioned fourth embodiment.

In the semiconductor laser device 190 according to the sixth embodiment, the semiconductor laser element 95 is fixed to the base 70 through a conductive bonding layer 60 so formed that the distance (corresponding to the distance H7 shown in FIG. 13) between the semiconductor laser element 95 and the base 70 around the center of the cavity is smaller than the distance (corresponding to the distance H8 shown in FIG. 13) between the semiconductor laser element 95 and the base 70 around the light reflecting surface 110b and around the light emitting surface 110a of the cavity, similarly to the sectional shape of the semiconductor laser element 50 along arrow B shown in FIG. 13. In the semiconductor laser element 95, the warping along arrow C is larger than the warp along arrow B, and hence the shape of the larger warp along arrow B is preferably fixed to the base 70 as in the shape shown in FIG. 13.

According to the sixth embodiment, the distance (corresponding to the distance H9) between the semiconductor laser element 95 and the base 70 along a cavity facet (the light emitting surface 110a or the light reflecting surface 110b) is smaller than the distance (corresponding to the distance H10 shown in FIG. 18) between the semiconductor laser element 95 and the base 70 around an end 95a of the semiconductor laser element 95 in the direction (along arrow C) along the cavity facet, similarly to the sectional shape of the semiconductor laser element 95 along arrow C shown in FIG. 18.

According to the sixth embodiment, a wire bonding portion 115a provided on a p-side electrode 115 of the semiconductor laser element 95 is so arranged as to correspond to the vicinity of the center of the cavity, as shown in FIG. 20. In other words, the wire bonding portion 115a is provided on a portion of the p-side electrode 115 corresponding to the vicinity of a region (where the conductive bonding layer 60 substantially has the thickness H7 (see FIG. 13) and the thickness H9 (see FIG. 18)) where the distance between the semiconductor laser element 95 and the base 70 is substantially the smallest. In the semiconductor laser element 95, the warp along arrow B is larger than the warp along arrow C, and hence the wire bonding portion 115a is preferably provided around a portion of the p-side electrode 115 corresponding to a portion where the thickness of the conductive bonding layer 60 having the larger warp along arrow B is the smallest.

The remaining structure of the semiconductor laser device 190 according to the sixth embodiment and a manufacturing process for a semiconductor laser comprising the semiconductor laser device 190 are similar to those of the aforementioned fourth embodiment.

According to the sixth embodiment, as hereinabove described, the wire bonding portion 115a is provided around the center of the semiconductor laser element 95 not only in the direction B (cavity direction) but also in the direction C (cross direction) so that an Au wire 90 is wire-boned to the wire bonding portion 115a from immediately above the wire bonding portion 115a substantially parallel to the upper surface 70a of the base 70 in the manufacturing process for the semiconductor laser comprising the semiconductor laser device 190, whereby the p-side electrode 115 can be reliably wire-bonded. The effects of the sixth embodiment are also similar to those of the aforementioned fourth embodiment.

Seventh Embodiment

Figure 21:
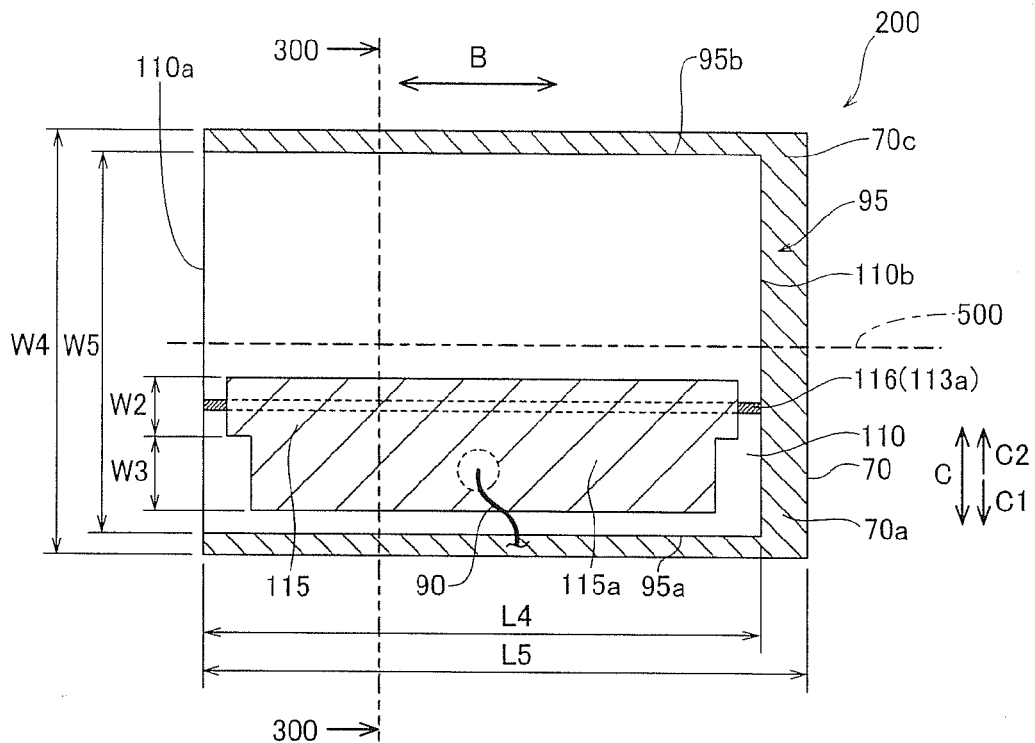
FIG. 21 is a plan view showing the structure of a semiconductor laser device according to a seventh embodiment of the present invention.
Figure 22:
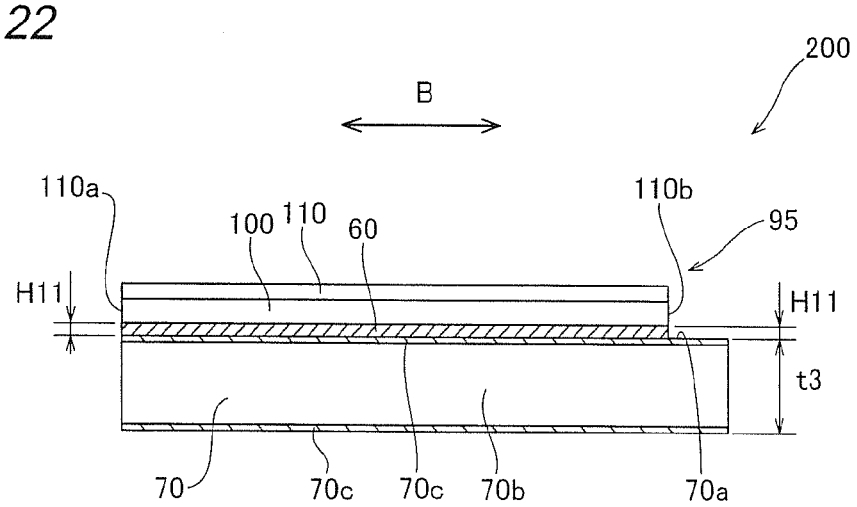
FIGS. 22 and 23 are sectional views showing the structure of the semiconductor laser device according to the seventh embodiment shown in FIG. 21.
Figure 23:
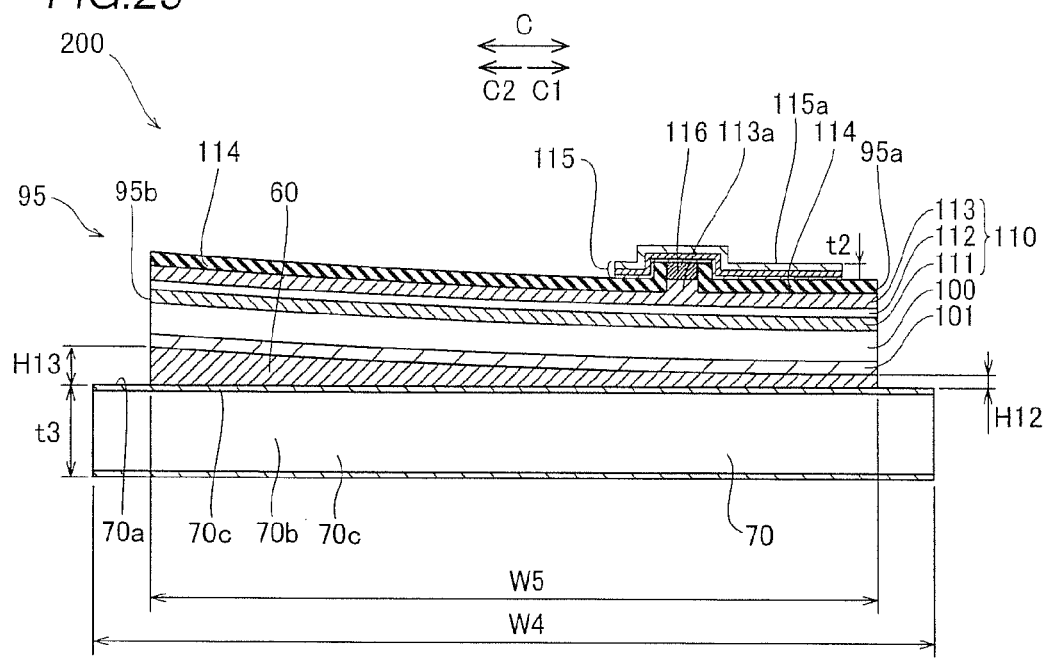

Referring to FIGS. 21 to 23, a semiconductor laser element 95 warped only in the cross direction of a laser element (along arrow C: perpendicular to the extensional direction of a cavity) is fixed to a base 70 in a semiconductor laser device 200 according to a seventh embodiment, dissimilarly to the aforementioned fourth embodiment. FIG. 22 is a sectional view along the extensional direction of the cavity of the semiconductor laser device 200 shown in FIG. 21, and FIG. 23 is a sectional view of the semiconductor laser device 200 taken along the line 300-300 in FIG. 21.

In a semiconductor laser comprising the semiconductor laser device 200 according to the seventh embodiment, the semiconductor laser element 95 is fixed to the base 70 through a conductive bonding layer 60, as shown in FIGS. 22 and 23.

According to the seventh embodiment, the semiconductor laser element 95 is warped only in the cross direction of the cavity (along arrow C). In other words, the semiconductor laser element 95 is so fixed to the base 70 that the distance (thickness of the conductive bonding layer 60) H12 between the semiconductor laser element 95 and the base 70 around an end 95a of the semiconductor laser element 95 in the direction (along arrow C1) along the cavity facet (light emitting surface 110a) is smaller than the distance (thickness of the conductive bonding layer 60) H13 between the semiconductor laser element 95 and the base 70 around an end 95b of the semiconductor laser element 95 along arrow C2, as shown in FIG. 23. A wire bonding portion 115a is provided around the end 95a of the semiconductor laser element 95 corresponding to a region where the semiconductor laser element 95 and the base 70 along arrow C1 are arranged substantially parallel to each other. According to the seventh embodiment, the semiconductor laser element 95 is not warped along the extensional direction (along arrow B) of the cavity, as shown in FIG. 22. Therefore, the distance (thickness of the conductive bonding layer 60) H11 between the semiconductor laser element 95 and the base 70 along arrow B (see FIG. 22) is substantially the same. Thus, the semiconductor laser element 95 is fixed to the base 70 in view of the warped shape along arrow C.

According to the seventh embodiment, the wire bonding portion 115a provided on a p-side electrode 115 of the semiconductor laser element 95 is formed to extend by a prescribed distance along the extensional direction (along arrow B) of the p-side electrode 115, as shown in FIG. 21. Therefore, an Au wire 90 in a manufacturing process for a semiconductor laser may be wire-bonded on any position along arrow B if it is on the wire bonding portion 115a. In other words, the Au wire 90 may be wire-bonded on any position around the light emitting surface 110a, a light reflecting surface 110b, or the center along arrow B of the wire bonding portion 115a. FIG. 21 shows an example of wire-bonding the Au wire 90 around the center along the arrow B.

The remaining structure of the semiconductor laser device 200 according to the seventh embodiment and a manufacturing process for a semiconductor laser comprising the semiconductor laser device 200 are similar to those of the aforementioned fourth embodiment.

According to the seventh embodiment, as hereinabove described, the semiconductor laser element 95 is fixed to the base 70 in view of the state of fixing of the warp along arrow C to the base 70, and hence the wire bonding portion 115a provided on a region of the semiconductor laser element 95 minimally inclined with respect to the upper surface 70a of the base 70 can be easily wire-bonded with the Au wire 90.

According to the seventh embodiment, the wire bonding portion 115a is provided around the end 95a of the semiconductor laser element 95 corresponding to a region where the semiconductor laser element 95 and the base 70 along arrow C1 are arranged substantially parallel to each other so that the Au wire 90 is wire-boned to the wire bonding portion 115a from immediately above the wire bonding portion 115a substantially parallel to the upper surface 70a of the base 70 in the manufacturing process for the semiconductor laser, whereby the p-side electrode 115 can be reliably wire-bonded.

According to the seventh embodiment, the wire bonding portion 115a is formed to extend by the prescribed distance along the extensional direction (along arrow B) of the p-side electrode 115, whereby the degree of the freedom of the wire-bonding position along arrow B of the Au wire 90 can be improved. The surface area along arrow B of the wire bonding portion 115a can be increased, and hence heat readability of the semiconductor laser element 95 can be improved through the p-side electrode 115.

Eighth Embodiment

Figure 24:
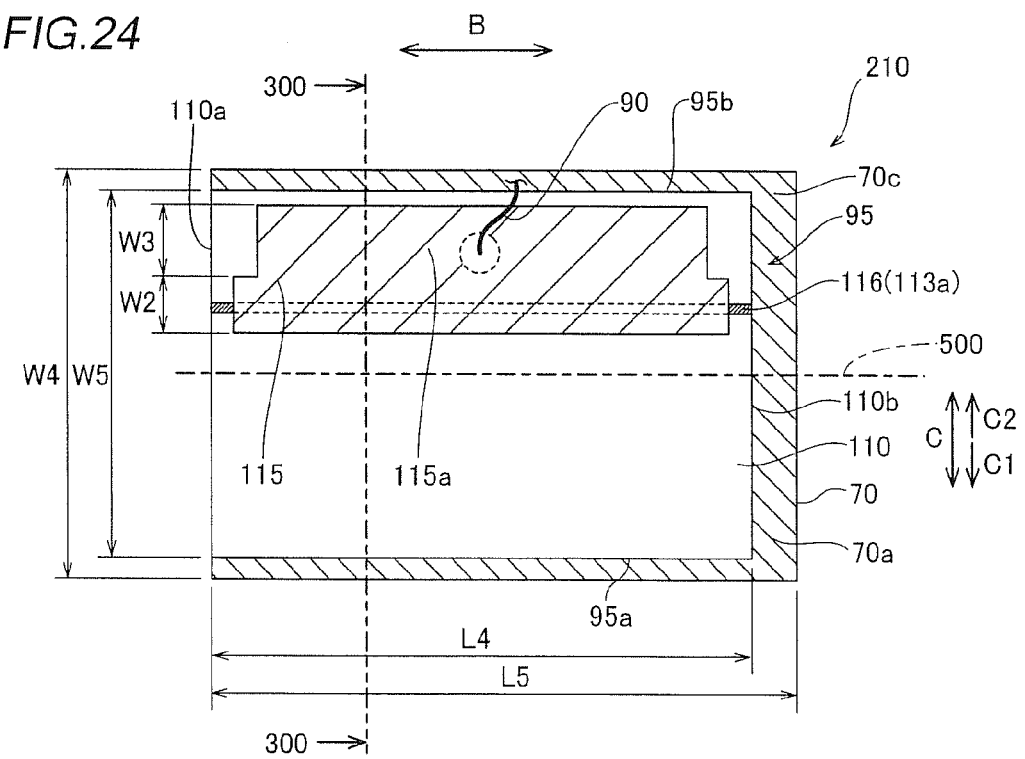
FIG. 24 is a plan view showing the structure of a semiconductor laser device according to an eighth embodiment of the present invention.
Figure 25:
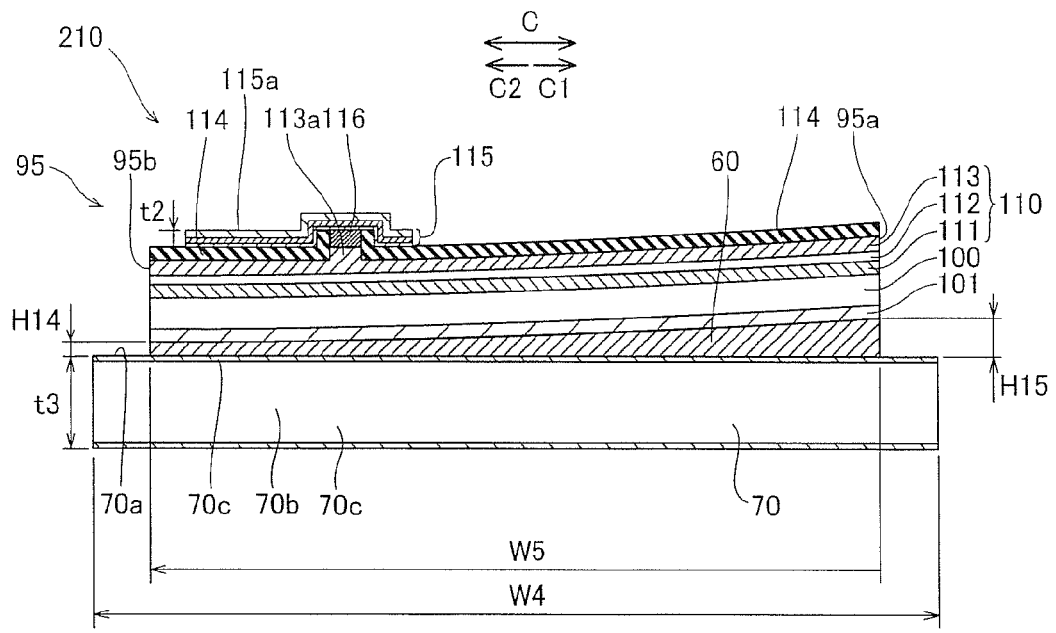
FIG. 25 is a sectional view showing the structure of the semiconductor laser device according to the eighth embodiment shown in FIG. 24.

Referring to FIGS. 24 and 25, a wire bonding portion 115a is formed on a side along arrow C2 as viewed from a light emitting surface 110a in a semiconductor laser device 210 according to an eighth embodiment dissimilarly to the aforementioned seventh embodiment. FIG. 25 is a sectional view of the semiconductor laser device 210 taken along the line 300-300 in FIG. 24.

In a semiconductor laser comprising the semiconductor laser device 210 according to the eighth embodiment, a semiconductor laser element 95 is fixed to a base 70 through a conductive bonding layer 60 (see FIG. 25), as shown in FIGS. 24 and 25.

According to the eighth embodiment, the semiconductor laser element 95 is so fixed to the base 70 that the distance (thickness of the conductive bonding layer 60) H14 between the semiconductor laser element 95 and the base 70 around an end 95b of the semiconductor laser element 95 in the direction (along arrow C2) along the cavity facet (light emitting surface 110a) is smaller than the distance (thickness of the conductive bonding layer 60) H15 between the semiconductor laser element 95 and the base 70 around an end 95a of the semiconductor laser element 95 in along arrow C1, as shown in FIG. 25. The wire bonding portion 115a is provided around the end 95b of the semiconductor laser element 95 corresponding to a region where the semiconductor laser element 95 and the base 70 along arrow C2 are arranged substantially parallel to each other.

According to the eighth embodiment, the wire bonding portion 115a provided on a p-side electrode 115 of the semiconductor laser element 95 is formed to extend by a prescribed distance along the extensional direction (along arrow B) of the p-side electrode 115, as shown in FIG. 24. Therefore, an Au wire 90 in a manufacturing process for a semiconductor laser may be wire-bonded on any position along arrow B if it is on the wire bonding portion 115a. In other words, the Au wire 90 may be wire-bonded on any position around the light emitting surface 110a, a light reflecting surface 110b, or the center along arrow B of the wire bonding portion 115a. FIG. 24 shows an example of wire-bonding the Au wire 90 around the center along the arrow B.

The remaining structure of the semiconductor laser device 210 according to the eighth embodiment and a manufacturing process for a semiconductor laser comprising the semiconductor laser device 210 are similar to those of the aforementioned seventh embodiment.

According to the eighth embodiment, as hereinabove described, the semiconductor laser element 95 is fixed to the base 70 in view of the state of fixing of the warp along arrow C to the base 70, and hence the wire bonding portion 115a provided on a region of the semiconductor laser element 95 minimally inclined with respect to the upper surface 70a of the base 70 can be easily wire-bonded with the Au wire 90.

According to the eighth embodiment, the wire bonding portion 115a is provided around the end 95b of the semiconductor laser element 95 corresponding to a region where the semiconductor laser element 95 and the base 70 along arrow C2 are arranged substantially parallel to each other so that the Au wire 90 is wire-boned to the wire bonding portion 115a from immediately above the wire bonding portion 115a substantially parallel to the upper surface 70a of the base 70 in the manufacturing process for the semiconductor laser comprising the semiconductor laser device 210, whereby the p-side electrode 115 can be reliably wire-bonded. The remaining effects of the eighth embodiment are similar to those of the aforementioned seventh embodiment.

Ninth Embodiment

Figure 26:
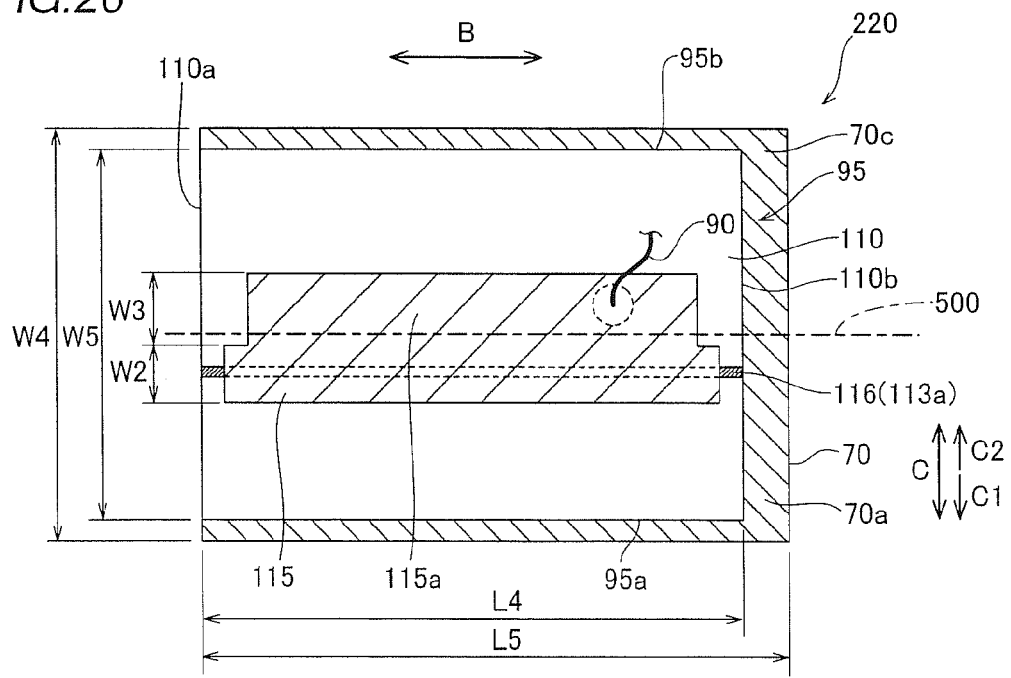
FIG. 26 is a plan view showing the structure of a semiconductor laser device according to a ninth embodiment of the present invention.

Referring to FIGS. 18, 22 and 26, a wire bonding portion 115a provided on a p-side electrode 115 is formed to extend by a prescribed distance along the extensional direction (along arrow B) of the p-side electrode 115 in a semiconductor laser device 220 according to a ninth embodiment dissimilarly to the aforementioned fourth embodiment.

In a semiconductor laser comprising the semiconductor laser device 220 according to the ninth embodiment, a semiconductor laser element 95 is fixed to a base 70 through a conductive bonding layer 60 (see FIG. 18), as shown in FIGS. 18 and 26.

According to the ninth embodiment, the wire bonding portion 115a provided on the p-side electrode 115 of the semiconductor laser element 95 is formed to extend by the prescribed distance along the extensional direction (along arrow B) of the p-side electrode 115, as shown in FIG. 26. Therefore, an Au wire 90 in a manufacturing process for a semiconductor laser may be wire-bonded on any position along arrow B if it is on the wire bonding portion 115a. In other words, the Au wire 90 may be wire-bonded on any position around a light emitting surface 110a, a light reflecting surface 110b, or the center along arrow B of the wire bonding portion 115a.

According to the ninth embodiment, the distance (corresponding to the distance H9 shown in FIG. 18) between the semiconductor laser element 95 and the base 70 around the center of the semiconductor laser element 95 in the direction (along arrow C) along a cavity facet is smaller than the distance (corresponding to the distance H10 shown in FIG. 18) between the semiconductor laser element 95 and the base 70 around an end 95a in the direction (along arrow C) along the cavity facet, similarly to the sectional shape of the semiconductor laser element 95 along arrow C shown in FIG. 18. Therefore, according to the ninth embodiment, the wire bonding portion 115a is provided on a portion of the p-side electrode 115 corresponding to the vicinity of a region (where the conductive bonding layer 60 substantially has the thickness H9 (see FIG. 18)) where the distance between the semiconductor laser element 95 and the base 70 is substantially the smallest. FIG. 26 shows an example of wire-bonding the Au wire 90 around the light reflecting surface 110b along the arrow B.

The remaining structure of the semiconductor laser device 220 according to the ninth embodiment and a manufacturing process for a semiconductor laser comprising the semiconductor laser device 220 are similar to those of the aforementioned fourth embodiment.

According to the ninth embodiment, as hereinabove described, the wire bonding portion 115a is provided around the center of the semiconductor laser element 95 not only in the direction B (cavity direction) but also in the direction C (cross direction) so that the Au wire 90 is wire-boned to the wire bonding portion 115a from immediately above the wire bonding portion 115a substantially parallel to the upper surface 70a of the base 70 along arrows B and C in the manufacturing process for the semiconductor laser comprising the semiconductor laser device 220, whereby the p-side electrode 115 can be reliably wire-bonded. The remaining effects of the ninth embodiment are similar to those of the aforementioned seventh embodiment.

Tenth Embodiment

Figure 27:
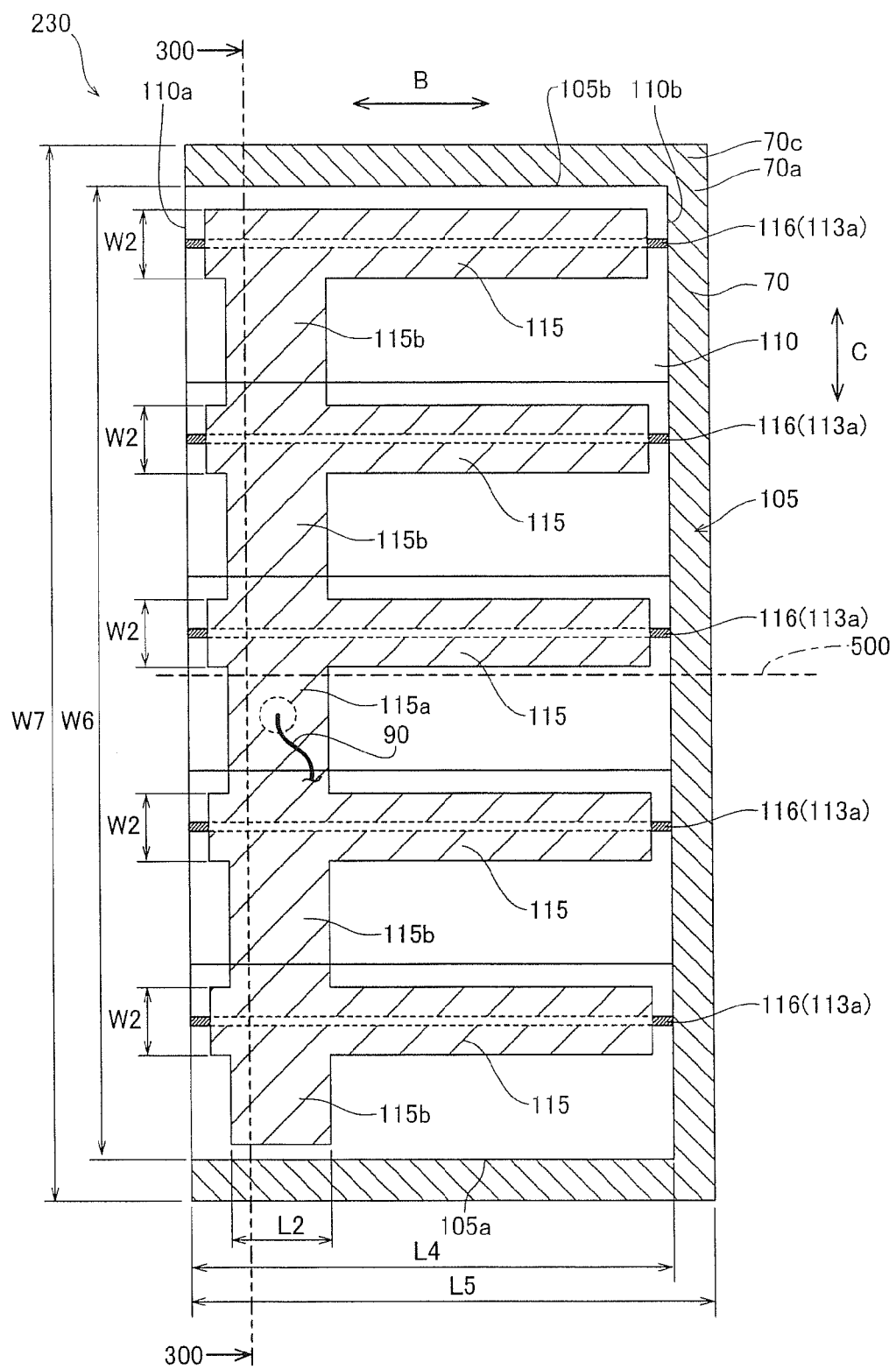
FIG. 27 is a plan view showing the structure of a semiconductor laser device according to a tenth embodiment of the present invention.
Figure 28:
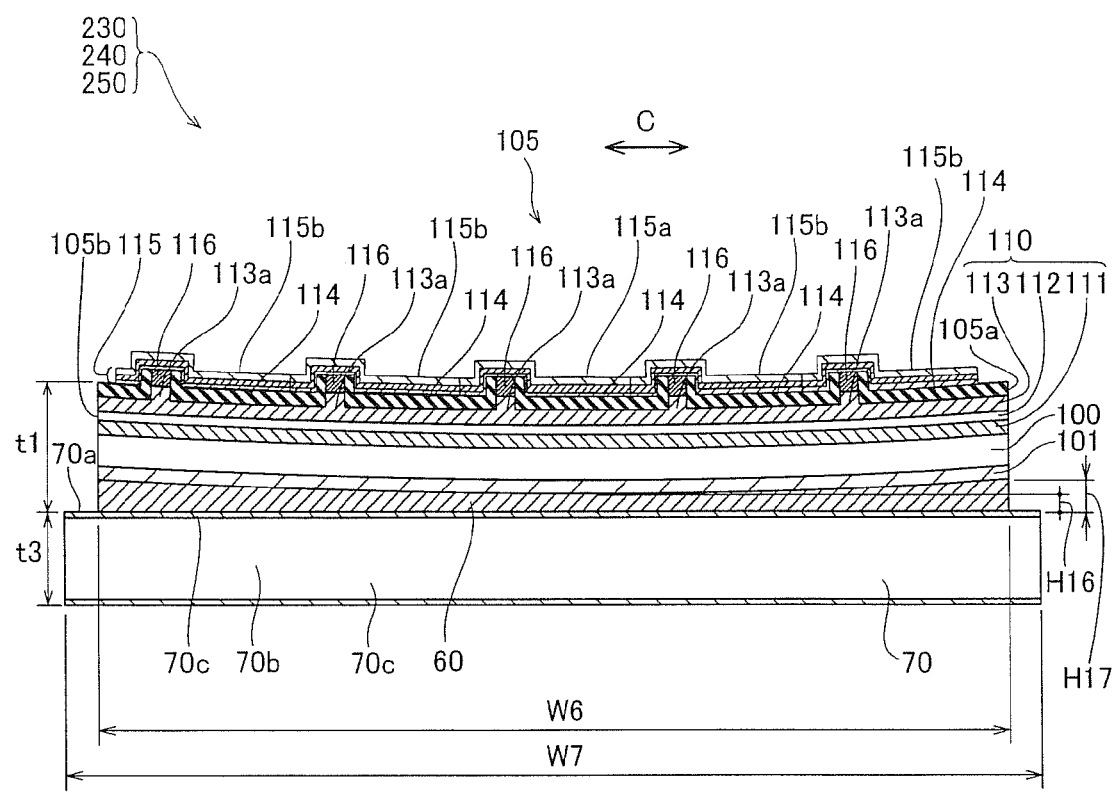
FIG. 28 is a sectional view showing the structure of the semiconductor laser device according to the tenth embodiment shown in FIG. 27.

Referring to FIGS. 3, 27 and 28, an arrayed semiconductor laser element 105 obtained by linking five semiconductor laser elements warped in the extensional direction (along arrow B) of cavities and in the cross direction (along arrow C) of the semiconductor laser elements with each other is fixed to a base 70 in a semiconductor laser device 200 according to a tenth embodiment of the present invention, dissimilarly to the aforementioned first embodiment. FIG. 28 is a sectional view of the semiconductor laser device 230 taken along the line 300-300 in FIG. 27.

In a semiconductor laser comprising the semiconductor laser device 230 according to the tenth embodiment, the arrayed semiconductor laser element 105 obtained by linking the five semiconductor laser elements provided with ridge portions 113a respectively is fixed to the base 70 through a conductive bonding layer 60 (see FIG. 28), as shown in FIGS. 27 and 28. In other words, the semiconductor laser element 105 is provided with five ridge portions 113a at a prescribed interval (about 200 μm) in the direction C. The semiconductor laser element 105 has a width (W6) of about 1000 μm, a length (L4) of about 900 μm and a thickness (t1) of about 100 μm. The base 70 has a width (W7) of about 1200 μm, a length (L5) of about 1000 μm and a thickness (t3) of about 250 μm. The sectional shape of the semiconductor laser element 105 along the extensional direction (along arrow B) of the cavities is similar to the sectional shape of the semiconductor laser element 50 shown in FIG. 3.

According to the tenth embodiment, the arrayed semiconductor laser element 105 is warped not only in the extensional direction (along arrow B in FIG. 27) of the cavities but also in the cross direction (along arrow C) of the cavities, as shown in FIG. 28. Therefore, the surface of a semiconductor laser element portion 110 opposite to a substrate 100 is concaved also in the cross direction (along arrow C) of the cavities, and the convex side (provided with the substrate 100) of the warp of the semiconductor laser element 105 is fixed to the base 70 along arrows B and C. The warp along arrow B is larger than the warp along arrow C, and hence the semiconductor laser element 105 is preferably fixed to the base 70 while giving priority to the shape of the larger warp along arrow B as the shape shown in FIG. 3.

According to the tenth embodiment, the distance (thickness of the conductive bonding layer 60) H16 between the semiconductor laser element 105 and the base 70 around the center of the semiconductor laser element 105 in the direction (along arrow C) along cavity facets (light emitting surfaces 110a or light reflecting surfaces 110b) is smaller than the distance (thickness of the conductive bonding layer 60) H17 between the semiconductor laser element 105 and the base 70 around ends 105a and 105b of the semiconductor laser element 105 in the direction (along arrow C) along the cavity facets, as shown in FIG. 28.

According to the tenth embodiment, wire bonding portions 115a provided on p-side electrodes 115 of the semiconductor laser element 105 are arranged on the upper surfaces of insulating films 114 around the light emitting surfaces 110a, as shown in FIG. 27. The wire bonding portions 115a are provided on portions of the p-side electrodes 115 corresponding to the vicinity of regions (where the conductive bonding layer 60 substantially has a thickness H3 (see FIG. 3) and the thickness H16 (see FIG. 28)) where the distance between the semiconductor laser element 105 and the base 70 is substantially the smallest along arrows B and C. In the semiconductor laser element 105, the warp along arrow C is larger than the warp along arrow B, whereby the wire bonding portion 115a is preferably provided around a portion of the p-side electrode 115 corresponding to a portion where the thickness of the conductive bonding layer 60 having the larger warp along arrow B is the smallest.

According to the tenth embodiment, the semiconductor laser element 105 is provided with a plurality of connecting portions 115b for connecting the plurality of (five) p-side electrodes 115 of the semiconductor laser element 105 with each other, as shown in FIG. 27. Thus, the plurality of (five) p-side electrodes 115 are rendered conductive through the connecting portions 115b. The plurality of connecting portions 115b are formed along arrow C to correspond to the positions provided with the wire bonding portions 115a in the cavity direction (along arrow B). Therefore, a current can be supplied to all semiconductor laser elements by connecting an Au wire 90 (see FIG. 2) to one of the wire bonding portions 115a located around the center along arrow C of the semiconductor laser device 230, as shown in FIG. 27.

The remaining structure of the semiconductor laser device 230 according to the tenth embodiment and a manufacturing process for the semiconductor laser comprising the semiconductor device 200 are similar to those of the aforementioned first embodiment.

According to the tenth embodiment, as hereinabove described, the arrayed semiconductor laser element 105 is so fixed to the base 70 that the distance between the convex side of the warp of the semiconductor laser element 105 and the base 70 varies with the warp of the semiconductor laser element 105 along the extensional direction (along arrow B) of the cavities and the cross direction (along arrow C) of the cavities, whereby the semiconductor laser element 105 can be fixed to the base 70 with no correction of the warp of the semiconductor laser element 105 itself even if the warp of the semiconductor laser element 105 is dispersed. Thus, the semiconductor laser element 105 can be prevented from excess stress resulting from correction of the warp. Therefore, deterioration of laser characteristics and breakage of the semiconductor laser element 105 can be suppressed. The remaining effects of the seventh embodiment are similar to those of the aforementioned first embodiment.

According to the tenth embodiment, the semiconductor laser element 105 is provided with the plurality of connecting portions 115b for linking the p-side electrodes 115 with each other along arrow C, whereby the plurality of (five) p-side electrodes 115 can be easily rendered conductive through the connecting portions 115*b*.

According to the tenth embodiment, the plurality of connecting portions 115*b* are so formed on the regions corresponding to the positions provided with the wire bonding portions 115*a* in the cavity direction (along arrow B) as to extend in the direction C so that the wire bonding portions 115*a* and the plurality of connecting portions 115*b* are substantially linearly arranged along arrow C, whereby the direction (positions of the light emitting surfaces 110*a*) of a laser beam emitted from the semiconductor laser element 105 can be easily identified by observing the semiconductor laser element 105 from above. The remaining effects of the tenth embodiment are similar to those of the aforementioned first embodiment.

Eleventh Embodiment

Figure 29:
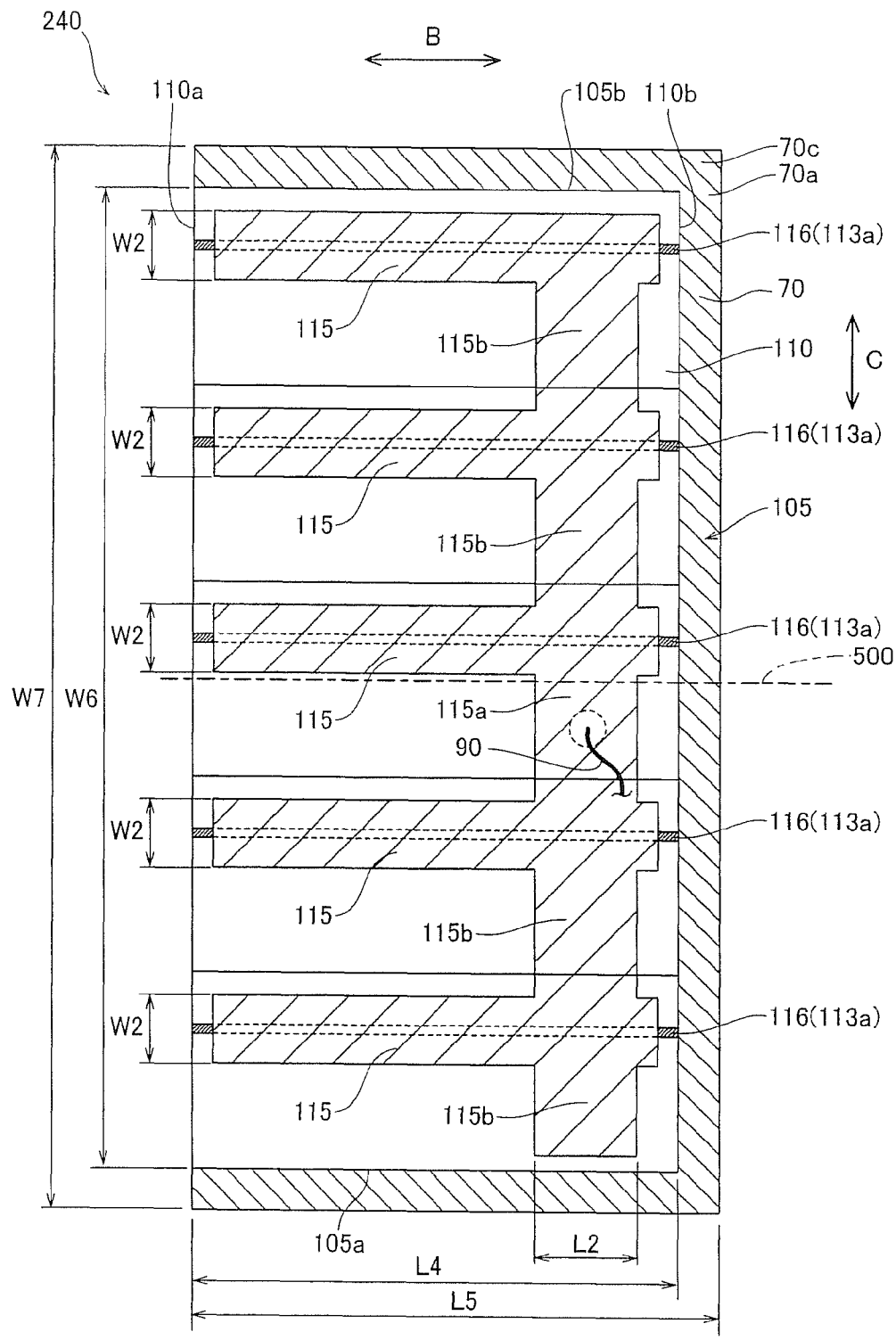
FIG. 29 is a plan view showing the structure of a semiconductor laser device according to an eleventh embodiment of the present invention.

Referring to FIGS. 9, 28 and 29, an arrayed semiconductor laser element 105 is so fixed to a base 70 that the distance between the semiconductor laser element 105 and the base 70 around light reflecting surfaces 110*b* of cavities is smaller than the distance between the semiconductor laser element 105 and the base 70 around light emitting surfaces 110*a* of the cavities in a semiconductor laser device 240 according to an eleventh embodiment of the present invention, dissimilarly to the aforementioned seventh embodiment.

In the semiconductor laser device 240 according to the eleventh embodiment, the semiconductor laser element 105 is fixed to the base 70 through a conductive bonding layer 60 so formed that the distance (corresponding to the distance H5 shown in FIG. 9) between the semiconductor laser element 105 and the base 70 around the light reflecting surfaces 110*b* of the cavities is smaller than the distance (corresponding to the distance H6 shown in FIG. 9) between the semiconductor laser element 105 and the base 70 around the light emitting surfaces 110*a* of the cavities, similarly to the sectional shape of the semiconductor laser element 50 along arrow B shown in FIG. 9. The warp along arrow B is larger than the warp along arrow C, and hence the semiconductor laser element 105 is preferably fixed to the base 70 while giving priority to the shape of the larger warp along arrow B as the shape shown in FIG. 9.

According to the eleventh embodiment, the distance (corresponding to the distance H16 shown in FIG. 28) between the semiconductor laser element 105 and the base 70 around the center in the direction (along arrow C) along cavity facets (the light emitting surfaces 110*a* or the light reflecting surfaces 110*b*) is smaller than the distance (corresponding to the distance H17 shown in FIG. 28) between the semiconductor laser element 105 and the base 70 around ends 105*a* and 105*b* of the semiconductor laser element 105 in the direction (along arrow C) along the cavity facets, similarly to the sectional shape of the semiconductor laser element 105 along arrow C shown in FIG. 28.

According to the eleventh embodiment, wire bonding portions 115*a* provided on p-side electrodes 115 of the semiconductor laser element 105 are arranged on the upper surfaces of insulating films 114 around the light emitting surfaces 110*a*, as shown in FIG. 29. In other words, the wire bonding portions 115*a* are provided on portions of the p-side electrodes 115 corresponding to the vicinity of regions (where the conductive bonding layer 60 substantially has the thickness H5 (see FIG. 9) and the thickness H16 (see FIG. 28)) where the distance between the semiconductor laser element 105 and the base 70 is substantially the smallest along arrows B and C.

In the semiconductor laser element 105, the warp along arrow C is larger than the warp along arrow B, whereby the wire bonding portion 115*a* is preferably provided around a portion of the p-side electrode 115 corresponding to a portion where the thickness of the conductive bonding layer 60 having the larger warp along arrow B is the smallest.

The remaining structure of the semiconductor laser device 240 according to the eleventh embodiment and a manufacturing process for a semiconductor laser comprising the semiconductor laser device 210 are similar to those of the aforementioned fourth embodiment. The effects of the eleventh embodiment are similar to those of the aforementioned tenth embodiment.

Twelfth Embodiment

Figure 30:
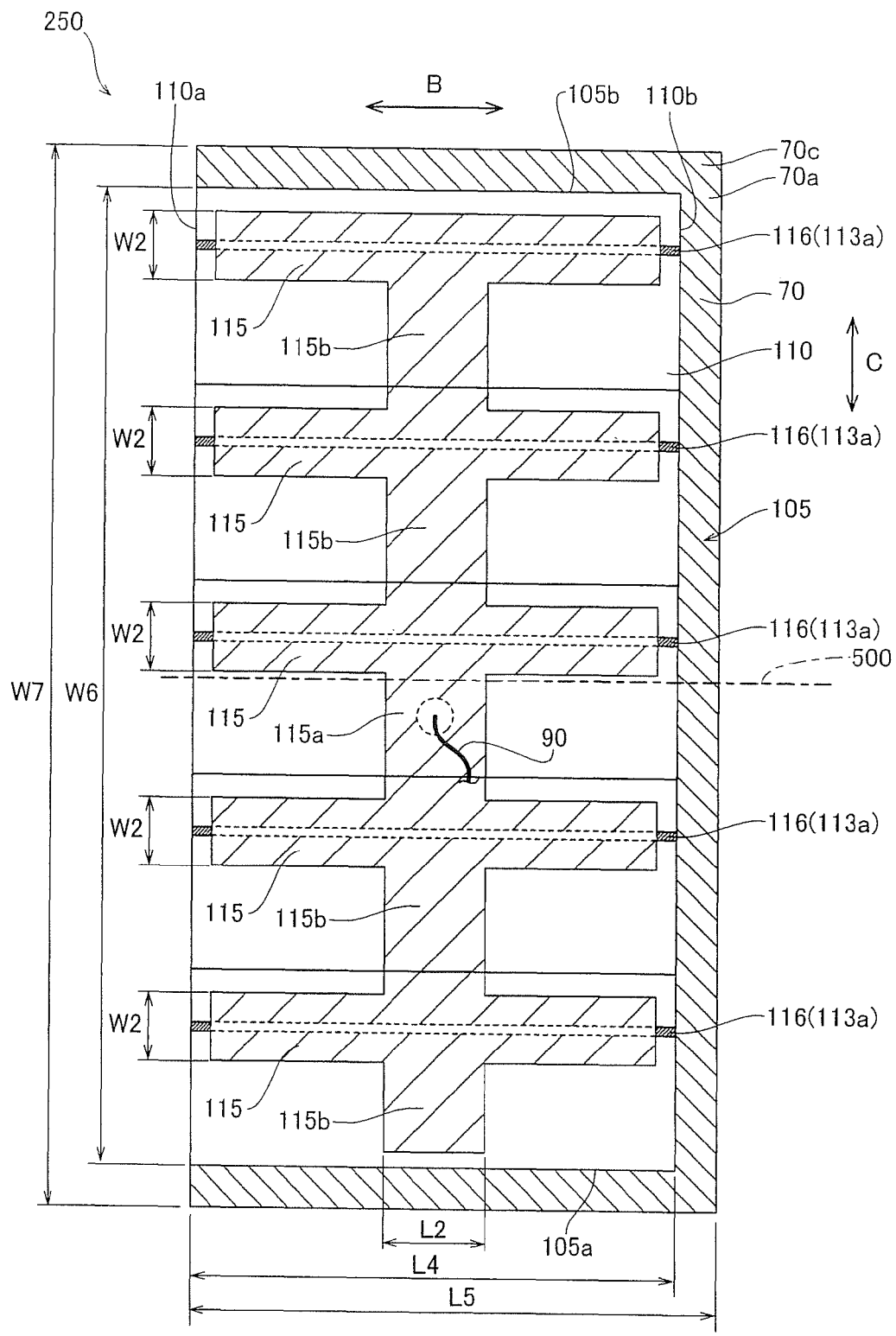
FIG. 30 is a plan view showing the structure of a semiconductor laser device according to a twelfth embodiment of the present invention.

Referring to FIGS. 13, 28 and 30, an arrayed semiconductor laser element 105 is so fixed to a base 70 that the distance between the semiconductor laser element 105 and the base 70 around the centers of cavities is smaller than the distance between the semiconductor laser element 105 and the base 70 around light reflecting surfaces 110*b* of the cavities and around light emitting surfaces 110*a* of the cavities in a semiconductor laser device 250 according to a twelfth embodiment of the present invention, dissimilarly to the aforementioned tenth embodiment.

In the semiconductor laser device 250 according to the twelfth embodiment, the semiconductor laser element 105 is fixed to the base 70 through a conductive bonding layer 60 so formed that the distance (corresponding to the distance H7 shown in FIG. 13) between the semiconductor laser element 105 and the base 70 around the centers of the cavities is smaller than the distance (corresponding to the distance H8 shown in FIG. 13) between the semiconductor laser element 105 and the base 70 around the light reflecting surfaces 110*b* of the cavities and around the light emitting surfaces 110*a* of the cavities, similarly to the sectional shape of the semiconductor laser element 50 along arrow B shown in FIG. 13. The warp along arrow B is larger than the warp along arrow C, and hence the semiconductor laser element 105 is preferably fixed to the base 70 while giving priority to the shape of the larger warp along arrow B as the shape shown in FIG. 13.

According to the twelfth embodiment, the distance (corresponding to the distance H16 in FIG. 28) between the semiconductor laser element 105 and the base 70 around the center in the direction (along arrow C) along cavity facets (the light emitting surfaces 110*a* or the light reflecting surfaces 110*b*) is smaller than the distance (corresponding to the distance H17 shown in FIG. 28) between the semiconductor laser element 105 and the base 70 around ends 105*a* and 105*b* of the semiconductor laser element 105 in the direction (along arrow C) along the cavity facets, similarly to the sectional shape of the semiconductor laser element 105 along arrow C shown in FIG. 28.

According to the twelfth embodiment, wire bonding portions 115*a* provided on p-side electrodes 115 of the semiconductor laser element 105 are so arranged as to correspond to the vicinity of the centers of the cavities, as shown in FIG. 30. In other words, the wire bonding portions 115*a* are provided on portions of the p-side electrodes 115 corresponding to the vicinity of regions (where the conductive bonding layer 60 substantially has the thickness H7 (see FIG. 13) and the thickness H16 (see FIG. 28)) where the distance between the semiconductor laser element 105 and the base 70 is substantially the smallest along arrows B and C. In the semiconductor laser element 105, the warp along arrow C is larger than the warp along arrow B, whereby the wire bonding portion 115*a* is preferably provided around a portion of the p-side electrode 115 corresponding to a portion where the thickness of the conductive bonding layer 60 having the larger warp along arrow B is the smallest.

The remaining structure of the semiconductor laser device 250 according to the twelfth embodiment and a manufacturing process for a semiconductor laser comprising the semiconductor laser device 220 are similar to those of the aforementioned fourth embodiment. The effects of the twelfth embodiment are similar to those of the aforementioned tenth embodiment.

Thirteenth Embodiment

Figure 31:
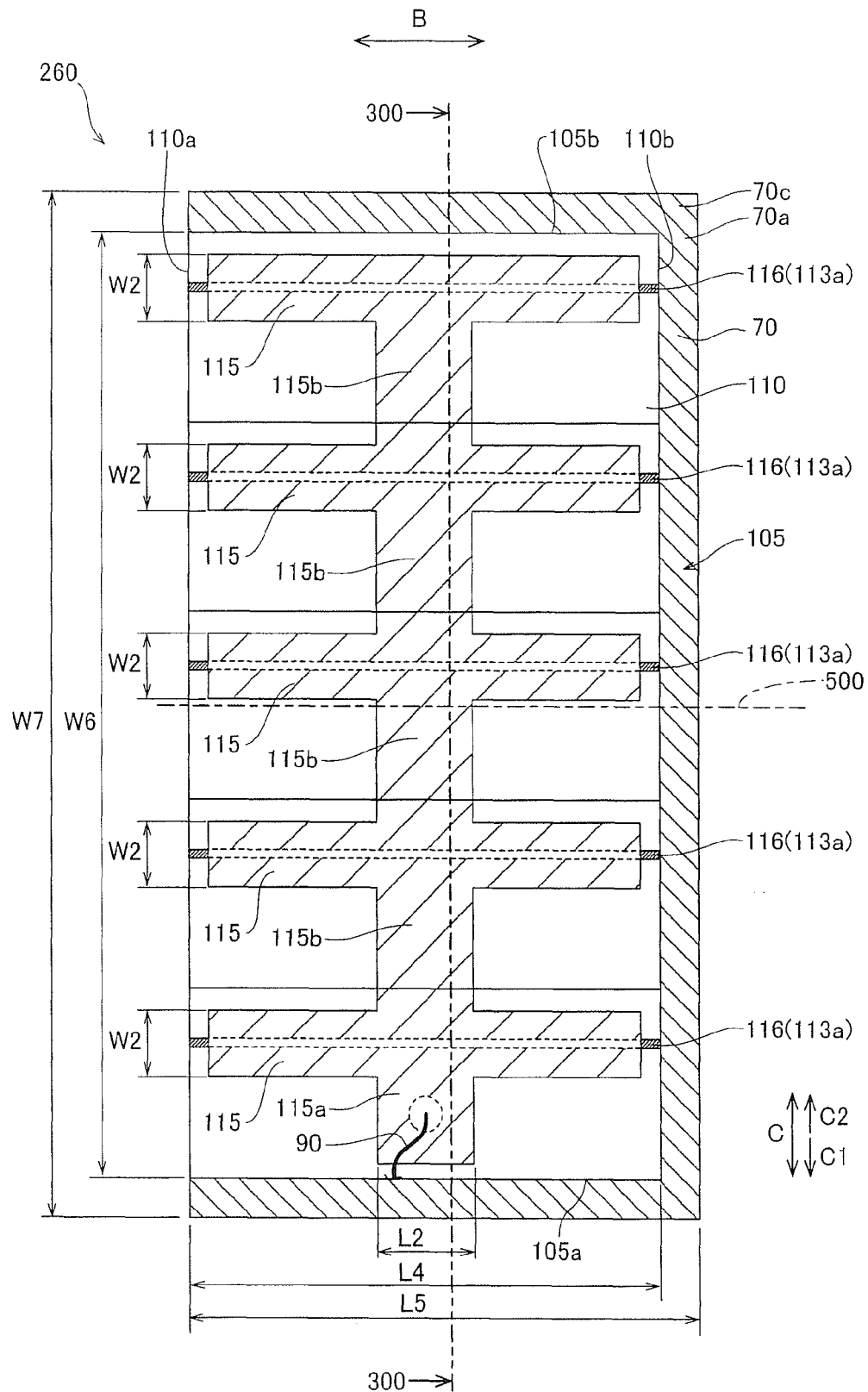
FIG. 31 is a plan view showing the structure of a semiconductor laser device according to a thirteenth embodiment of the present invention.
Figure 32:
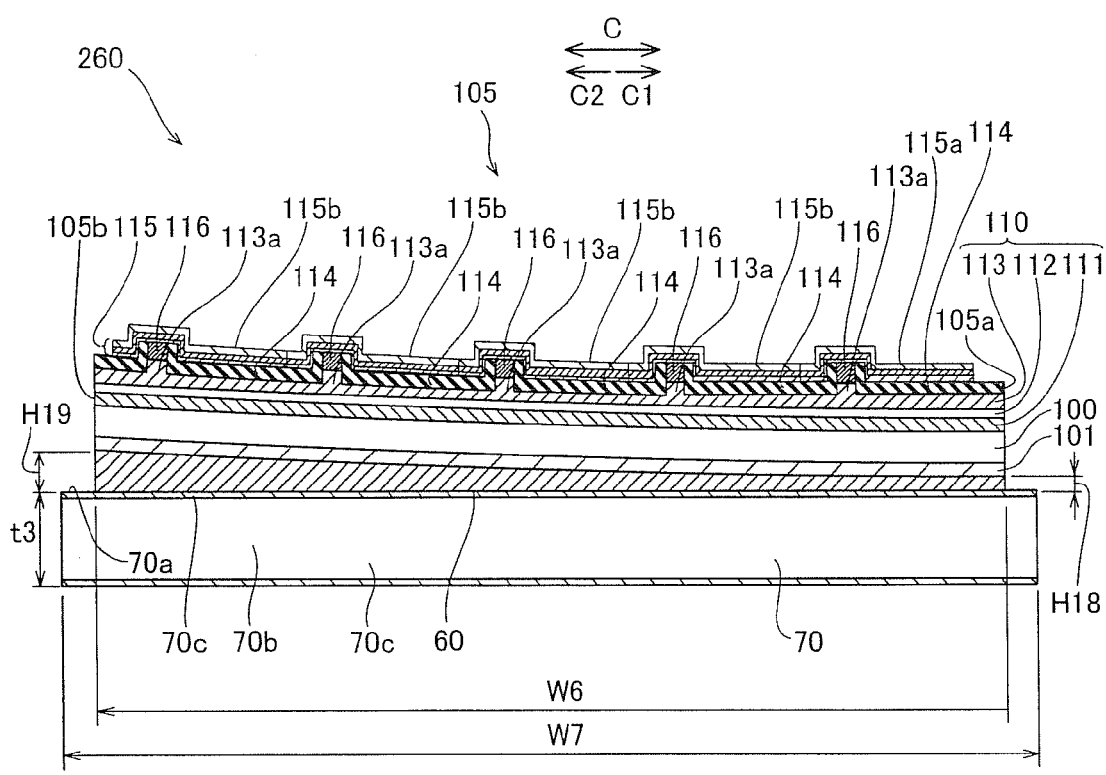
FIG. 32 is a sectional view showing the structure of the semiconductor laser device according to the thirteenth embodiment shown in FIG. 31.

Referring to FIGS. 13, 31 and 32, a wire bonding portion 115a is formed around an end 105a along arrow C1 as viewed from a light emitting surfaces 110a of an arrayed semiconductor laser element 105 having a warp in the cross direction (along arrow C) of cavities in a semiconductor laser device 260 according to an thirteenth embodiment dissimilarly to the aforementioned twelfth embodiment. FIG. 32 is a sectional view of the semiconductor laser device 260 taken along the line 300-300 shown in FIG. 31.

In the semiconductor laser device 260 according to the thirteenth embodiment, the semiconductor laser element 105 is so fixed to a base 70 through a conductive bonding layer 60 formed that the distance (corresponding to the distance H7 shown in FIG. 13) between the semiconductor laser element 105 and the base 70 around the center of the cavities is smaller than the distance (corresponding to the distance H8 shown in FIG. 13) between the semiconductor laser element 105 and the base 70 around light reflecting surfaces 110b and the light emitting surfaces 110a of cavities, similarly to the sectional shape of the semiconductor laser element 50 along arrow B shown in FIG. 13. The warp along arrow B is larger than the warp along arrow C, and hence the semiconductor laser element 105 is preferably fixed to the base 70 while giving priority to the shape of the larger warp along arrow B as the shape shown in FIG. 13.

According to the thirteenth embodiment, the semiconductor laser element 105 is so fixed to the base 70 that the distance (thickness of the conductive bonding layer 60) H18 between the semiconductor laser element 105 and the base 70 around the end 105a of the semiconductor laser element 105 in the direction (along arrow C1) along the cavity facets (light emitting surfaces 110a) is smaller than the distance (thickness of the conductive bonding layer 60) H19 between the semiconductor laser element 105 and the base 70 around an end 105b of the semiconductor laser element 105 in along arrow C2, as shown in FIG. 32. Therefore, the wire bonding portion 115a is provided on a portion of the p-side electrode 115 corresponding to the vicinity of a region (where the conductive bonding layer 60 substantially has a thickness H18) where the distance between the semiconductor laser element 105 and the base 70 is substantially the smallest along arrow C. The wire bonding portion 115a is provided around the end 105a of the semiconductor laser element 105 corresponding to a region where the semiconductor laser element 105 and the base 70 along arrow C1 are arranged substantially parallel to each other.

The remaining structure of the semiconductor laser device 260 according to the thirteenth embodiment and a manufacturing process for a semiconductor laser comprising the semiconductor laser device 260 are similar to those of the aforementioned twelfth embodiment.

According to the thirteenth embodiment, as hereinabove described, the wire bonding portion 115a is provided around the end 105a of the semiconductor laser element 105 corresponding to the region where the semiconductor laser element 105 and the base 70 along arrow C1 are arranged substantially parallel to each other so that an Au wire 90 is wire-boned to the wire bonding portion 115a from immediately above the wire bonding portion 115a substantially parallel to the upper surface 70a of the base 70 in the manufacturing process for the semiconductor laser comprising the semiconductor laser device 260, whereby the p-side electrode 115 can be reliably wire-bonded. The remaining effects of the thirteenth embodiment are similar to those of the aforementioned tenth embodiment.

Fourteenth Embodiment

Figure 33:
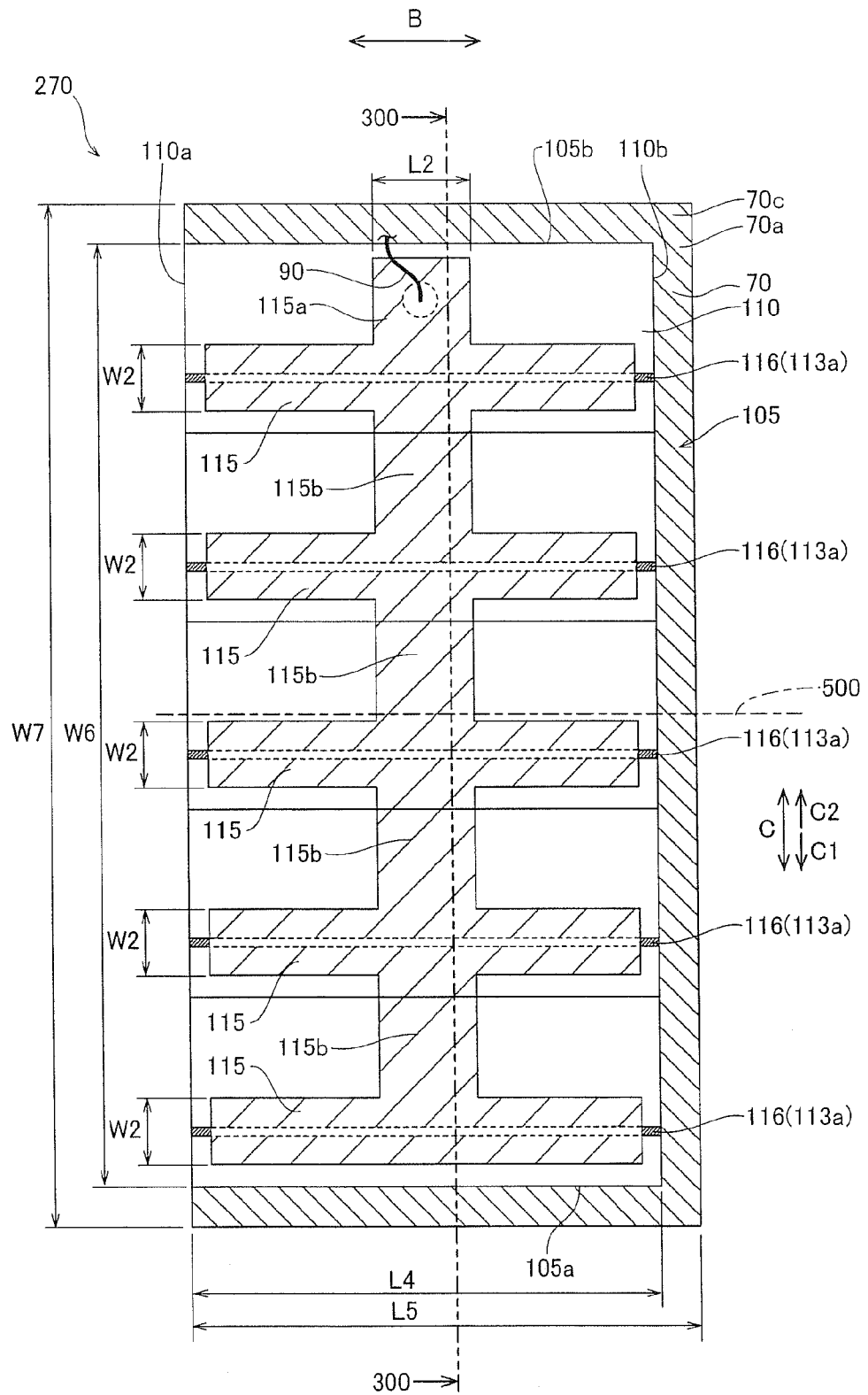
FIG. 33 is a plan view showing the structure of a semiconductor laser device according to a fourteenth embodiment of the present invention.
Figure 34:
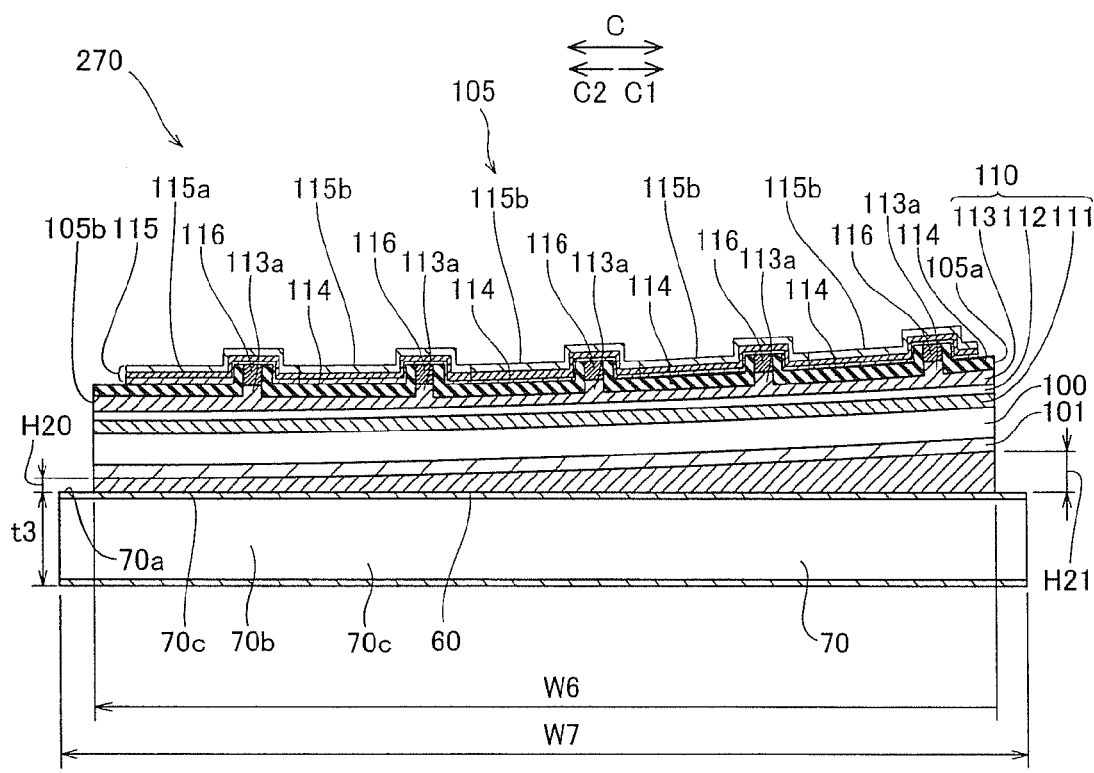
FIG. 34 is a sectional view showing the structure of the semiconductor laser device according to the fourteenth embodiment shown in FIG. 33.

Referring to FIGS. 13, 33 and 34, a wire bonding portion 115a is formed around an end 105b along arrow C2 as viewed from a light emitting surfaces 110a of an arrayed semiconductor laser element 105 having a warp in the cross direction (along arrow C) of cavities in a semiconductor laser device 270 according to an fourteenth embodiment dissimilarly to the aforementioned thirteenth embodiment. FIG. 34 is a sectional view of the semiconductor laser device 270 taken along the line 300-300 shown in FIG. 33.

In the semiconductor laser device 270 according to the fourteenth embodiment, the semiconductor laser element 105 is so fixed to a base 70 through a conductive bonding layer 60 formed that the distance (corresponding to the distance H7 shown in FIG. 13) between the semiconductor laser element 105 and the base 70 around the center of the cavities is smaller than the distance (corresponding to the distance H8 shown in FIG. 13) between the semiconductor laser element 105 and the base 70 around light reflecting surfaces 110b and the light emitting surfaces 110a of cavities, similarly to the sectional shape of the semiconductor laser element 50 along arrow B shown in FIG. 13.

According to the fourteenth embodiment, the semiconductor laser element 105 is so fixed to the base 70 that the distance (thickness of the conductive bonding layer 60) H20 between the semiconductor laser element 105 and the base 70 around the end 105b of the semiconductor laser element 105 in the direction (along arrow C2) along the cavity facets (light emitting surfaces 110a) is smaller than the distance (thickness of the conductive bonding layer 60) H21 between the semiconductor laser element 105 and the base 70 around an end 105a of the semiconductor laser element 105 along arrow C1, as shown in FIG. 34. Therefore, the wire bonding portion 115a is provided on a portion of the p-side electrode 115 corresponding to the vicinity of a region (where the conductive bonding layer 60 substantially has a thickness H20) where the distance between the semiconductor laser element 105 and the base 70 is substantially the smallest along arrow C. The wire bonding portion 115a is provided around the end 105b of the semiconductor laser element 105 corresponding to a region where the semiconductor laser element 105 and the base 70 along arrow C2 are arranged substantially parallel to each other.

The remaining structure of the semiconductor laser device 270 according to the fourteenth embodiment and a manufacturing process for a semiconductor laser comprising the semiconductor laser device 270 are similar to those of the aforementioned thirteenth embodiment.

According to the fourteenth embodiment, as hereinabove described, the wire bonding portion 115a is provided around the end 105b of the semiconductor laser element 105 corresponding to the region where the semiconductor laser element 105 and the base 70 along arrow C2 are arranged substantially parallel to each other so that an Au wire 90 is wire-boned to the wire bonding portion 115*a* from immediately above the wire bonding portion 115*a* substantially parallel to the upper surface 70*a* of the base 70 in the manufacturing process for the semiconductor laser comprising the semiconductor laser device 250, whereby the p-side electrode 115 can be reliably wire-bonded. The remaining effects of the fourteenth embodiment are similar to those of the aforementioned tenth embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while the semiconductor laser element portion is constituted of the nitride-based semiconductor layers in each of the aforementioned embodiments, the present invention is not restricted to this but the semiconductor laser element portion may alternatively be constituted of semiconductor layers other than the nitride-based semiconductor layers.

While the fusible layer for fixing the semiconductor laser element to the base is formed by the conductive bonding layer of solder in each of the aforementioned embodiments, the present invention is not restricted to this but the fusible layer for fixing the semiconductor laser element to the base may alternatively be formed by a conductive bonding layer of a material other than solder.

While the light emitting surface of the semiconductor laser element is arranged substantially parallelly to the upper surface of the base in the aforementioned first embodiment, the present invention is not restricted to this but the light emitting surface of the semiconductor laser element may not be arranged substantially parallelly to the upper surface of the base.

While the light reflecting surface of the semiconductor laser element is arranged substantially parallelly to the upper surface of the base in the aforementioned second embodiment, the present invention is not restricted to this but the light reflecting surface of the semiconductor laser element may not be arranged substantially parallelly to the upper surface of the base.

While the portion of the semiconductor laser element around the center of the cavity is arranged substantially parallelly to the upper surface of the base in the aforementioned third embodiment, the present invention is not restricted to this but the portion of the semiconductor laser element around the center of the cavity may not be arranged substantially parallelly to the upper surface of the base.

While the semiconductor laser element is pressed against the base with the collet when fixed to the base in each of the aforementioned embodiments, the present invention is not restricted to this but the semiconductor laser element may alternatively be pressed against the base with a member other than the collet when fixed to the base.

While the thickness of the conductive bonding layer changes in three or two ways (three or two stages) in the longitudinal direction of the cavity in the manufacturing process for the semiconductor laser comprising the semiconductor laser device according to each of the aforementioned embodiments, the present invention is not restricted to this but the conductive bonding layer may alternatively be arranged on the upper surface of the base so that the thickness thereof changes in a number of ways (stages) other than three or two ways (three or two stages) in the longitudinal direction of the cavity.

While the wire bonding portion(s) 115*a* is provided around the portion(s) of the p-side electrode(s) 115 corresponding to the vicinity of the substantially central portion of the semiconductor laser element in the cross direction (along arrow C) in each of the aforementioned embodiments, the present invention is not restricted to this but the wire bonding portion(s) may alternatively be provided around a portion of the p-side electrode(s) corresponding to the vicinity of an end of the semiconductor laser element along arrow C if the semiconductor laser element warped in the cross direction (along arrow C) thereof is fixed to the base so that the distance between the end of the semiconductor laser element along arrow C and the base is substantially the smallest.

While the wire bonding portion(s) 115*a* is provided on the position(s) corresponding to the vicinity of the region where distance between the semiconductor laser element and the base 70 is substantially the smallest in each of the aforementioned embodiments, the present invention is not restricted to this but the wire bonding portion(s) 115*a* may alternatively be provided in the vicinity (in a prescribed range) of a position of the p-side electrode(s) 115 corresponding to the vicinity of the region where the distance between the semiconductor laser element and the base 70 is substantially the smallest.

Figure 35:
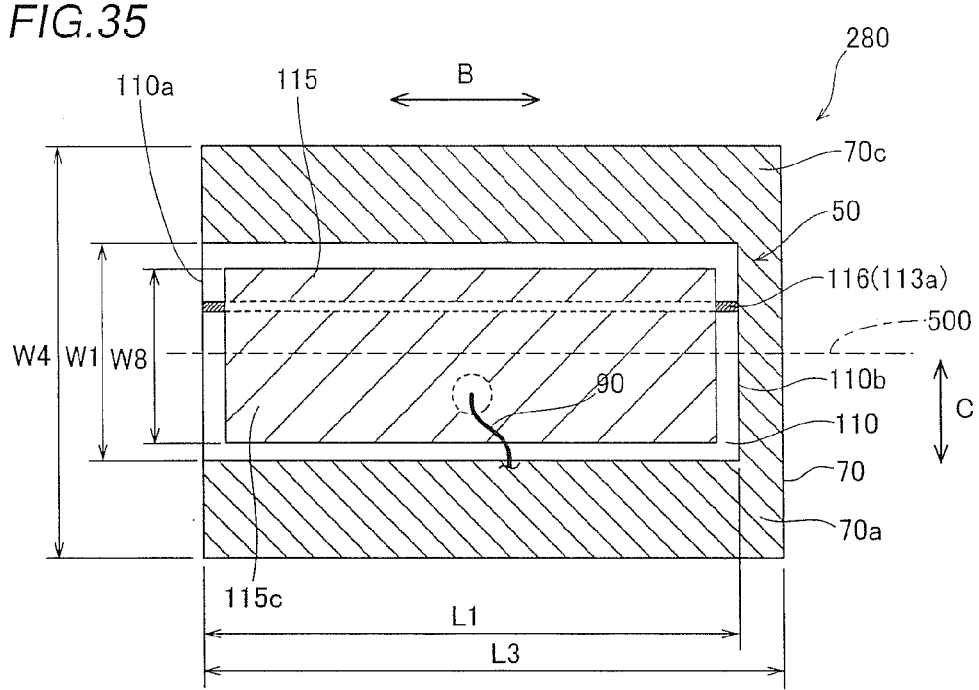
FIG. 35 is a plan view showing a first modification of the semiconductor laser device according to each embodiment of the present invention.

While the wire bonding portion(s) 115*a* of the p-side electrode(s) 115 of the semiconductor laser element is provided on the position of the p-side electrode(s) 115 corresponding to the vicinity of the region where the distance between the semiconductor laser element and the base 70 is substantially the smallest to protrude from the p-side electrode(s) 115 in the cross direction (along arrow C) of the semiconductor laser element in each of the aforementioned first to third embodiments, the present invention is not restricted to this but a wire bonding portion 115*c* of a semiconductor laser device 280 may alternatively be so formed as to extend along all region in the extensional direction (along arrow B) of a p-side electrode 115 of a semiconductor laser element 50, as in a first modification shown in FIG. 35. The p-side electrode 115 including the wire bonding portion 115*c* has a width W8 of about 110 μm in the direction C. In this case, the wire bonding portion 115*c* may be wire-bonded with an Au wire 90 on a position corresponding to the vicinity of a region where the distance between the semiconductor laser element 50 warped in the cavity direction (along arrow B) and the base 70 is substantially the smallest in a wire bonding step of a manufacturing process for a semiconductor laser comprising the semiconductor laser device 240. FIG. 35 shows an example of wire-bonding the Au wire 90 on a portion of the wire bonding portion 115*c* around the center along the arrow B. According to this structure of the first modification, the surface area of the p-side electrode 115 including the wire bonding portion 115*c* can be increased in addition to the effects of the aforementioned embodiments, whereby heat readability of the semiconductor laser element 50 can be improved through the p-side electrode 115.

Figure 36:
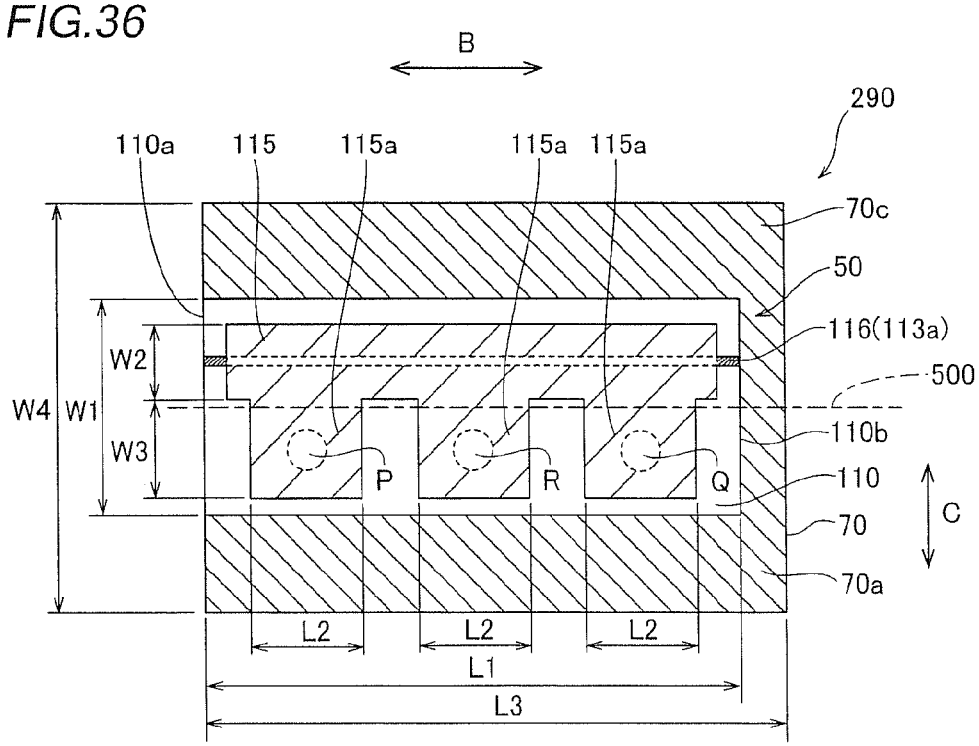
FIG. 36 is a plan view showing a second modification of the semiconductor laser device according to each embodiment of the present invention.

While the wire bonding portion 115*a* of the p-side electrode 115 of the semiconductor laser element is so provided on the p-side electrode only at the position where the Au wire 90 is actually wire-bonded as to protrude from the p-side electrode 115 along arrow C in each of the aforementioned first to third embodiments, the present invention is not restricted to this but a plurality (three) of wire bonding portions of a semiconductor laser device 290 may be formed at prescribed intervals in the extensional direction (along arrow B) of a p-side electrode 115 of a semiconductor laser device 50 as in a second modification shown in FIG. 36. When the warp in the cavity direction of the semiconductor laser element is the sectional shape shown in FIG. 3, the Au wire 90 may be wire-bonded on a portion of the wire bonding portion 115a at a position P shown in FIG. 36. When the warp in the cavity direction of the semiconductor laser element is the sectional shape shown in FIG. 9, the Au wire 90 may be wire-bonded on a portion of the wire bonding portion 115a at a position Q shown in FIG. 36. When the warp in the cavity direction of the semiconductor laser element is the sectional shape shown in FIG. 13, the Au wire 90 may be wire-bonded on a portion of the wire bonding portion 115a at a position R shown in FIG. 36. According to this structure of the second modification, the wire bonding portion 115a around a region where the distance between the convex side of the warp of the semiconductor laser element 50 and the base 70 is the smallest can be easily wire-bonded according to a design condition of the semiconductor laser device 290.

Figure 37:
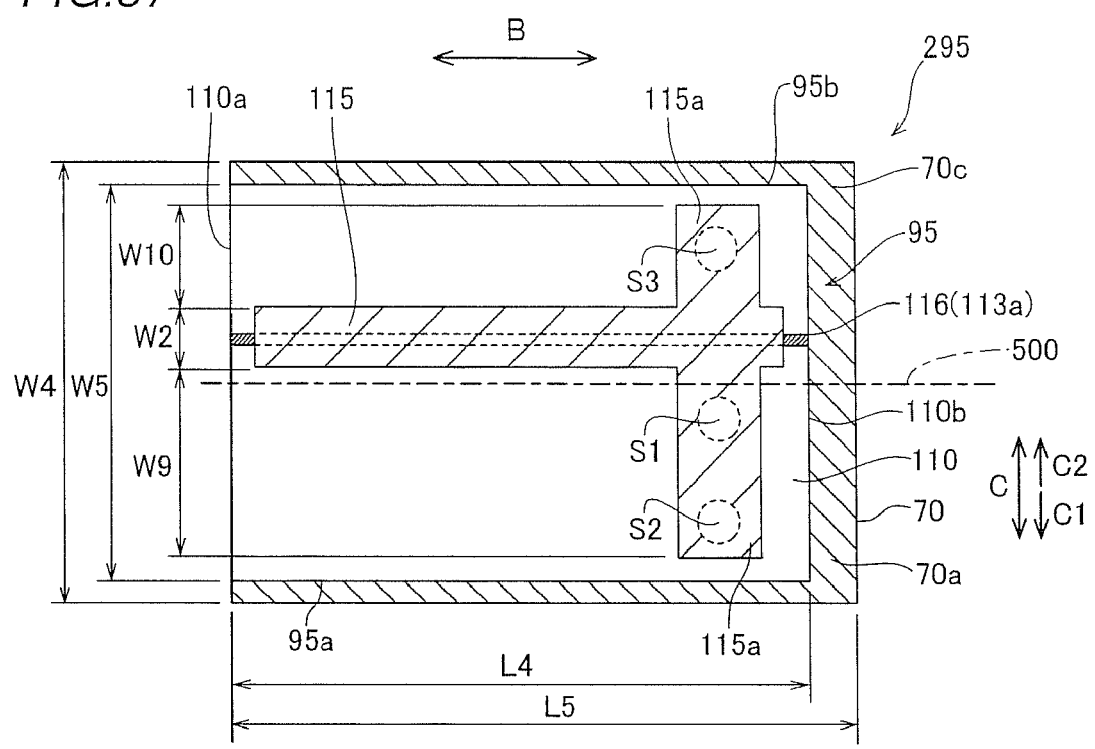
FIG. 37 is a plan view showing a third modification of the semiconductor laser device according to each embodiment of the present invention.

While the wire bonding portion 115a of the p-side electrode 115 of the semiconductor laser element having the warp along arrows B and C is provided on the p-side electrode 115 to protrude from the p-side electrode 115 along arrow C (along arrow C1 or C2) by the width W3 in each of the aforementioned fourth to sixth embodiments, the present invention is not restricted to this but wire bonding portions 115a of a semiconductor laser device 295 may be formed to protrude along arrows C1 and C2 by widths W9 and W10 respectively and extend up to positions corresponding portions around ends 95a and 95b along arrow C, as in a third modification shown in FIG. 37. When the warp in the cavity direction (along arrow B) of the semiconductor laser device is the sectional shape shown in FIG. 9, it is most preferable to wire-bond the Au wire 90 on a portion of the wire bonding portion 115a at a position S1 shown in FIG. 37. The Au wire 90 may be wire-bonded on a portion of the wire bonding portion 115a at a position S2 or S3 shown in FIG. 37. When the warp in the cavity direction (along arrow B) of the semiconductor laser device is the sectional shape shown in FIGS. 3 and 13, the wire bonding portions 115a (see FIG. 37) of the semiconductor laser device 295 is preferably formed to protrude from a portion of the p-side electrode 115 corresponding to the vicinity of a region where the distance between the semiconductor laser element and the base is substantially the smallest (a light emitting surface 110a or a light reflecting surface 110b). According to this structure of the third modification, the degree of the freedom of the wire-bonding position along arrow C of the Au wire 90 can be improved according to a design condition of the semiconductor laser device 295.

While the wire bonding portion 115a is formed to protrude from the p-side electrode 115 along arrow C2 as viewed from the light emitting surface 110a in the aforementioned ninth embodiment, the present invention is not restricted to this but the wire bonding portion 115a may be formed to protrude from the p-side electrode 115 along arrow C1 as viewed from the light emitting surface 110a. In this case, a ridge portion 113a (p-side electrode 115) of the semiconductor laser element 95 is formed on a side along arrow C2 with respect to a centerline 500.

While the p-side electrode 115 (wire bonding portion 115a) of the semiconductor laser element 50 and the lead terminal 83 of the stem 80 are connected with each other through the single Au wire 90 in each of the aforementioned embodiments as shown in FIG. 2, the present invention is not restricted to this but the p-side electrode 115 and the lead terminal 83 may alternatively be connected with each other through a plurality of (e.g., three) Au wires. According to the structure of this second modification, the number of the Au wires connected to the p-side electrode 115 is so increased that heat generated in the semiconductor laser element can be effectively radiated from the semiconductor laser device through the plurality of Au wires and the lead terminal 83, in addition to the effects of the aforementioned embodiments and the aforementioned first modification.

What is claimed is:

1. A semiconductor laser device comprising:
    a semiconductor laser element having a warp in a first direction corresponding to an extensional direction of a cavity;
    an electrode layer formed on a surface of a concave side of said warp in said first direction and provided with a wire bonding portion; and
    a base to which a convex side of said warp in said first direction is fixed, wherein
    said warp in said first direction is larger than a warp of said semiconductor laser element in a second direction intersecting with said first direction,
    said semiconductor laser element is so fixed to said base that a distance between said convex side and said base varies with said warp in said first direction, and
    said wire bonding portion is provided around a portion of a vicinity of a either a light emitting end or a light reflecting end of said cavity positioned on an end of said semiconductor laser element in said first direction where said distance is substantially the smallest.

2. The semiconductor laser device according to claim 1, wherein
    said semiconductor laser element includes a substrate and a semiconductor laser element portion formed on a surface of said substrate,
    a side of said semiconductor laser element provided with said substrate is fixed to said base through a fusible layer, and
    said fusible layer is so formed that a thickness thereof varies with said warp in said first direction on a region held between said substrate of said semiconductor laser element and said base.

3. The semiconductor laser device according to claim 2, wherein
    said fusible layer fixing said semiconductor laser element to said base is a conductive bonding layer made of solder.

4. The semiconductor laser device according to claim 1, wherein
    said semiconductor laser element includes a semiconductor laser element portion having a nitride-based semiconductor layer.

5. The semiconductor laser device according to claim 1, wherein
    said wire bonding portion is provided around a portion of said electrode layer around a region corresponding to said light emitting end of said cavity.

6. The semiconductor laser device according to claim 5, wherein
    a lower surface of said semiconductor laser element around said light emitting end of said cavity is arranged substantially parallel to an upper surface of said base.

7. The semiconductor laser device according to claim 1, wherein
    said wire bonding portion is provided around a portion of said electrode layer around a region corresponding to said light reflecting end of said cavity.

8. The semiconductor laser device according to claim 7, wherein
    a lower surface of said semiconductor laser element around said light reflecting end of said cavity is arranged substantially parallel to an upper surface of said base.

9. The semiconductor laser device according to claim 1, wherein
said wire bonding portion is provided around an end of said semiconductor laser element corresponding to a region where said semiconductor laser element in said second direction and said base are arranged substantially parallel to each other.

10. The semiconductor laser device according to claim 1, wherein
said wire bonding portion is provided around a portion of said electrode layer corresponding to the vicinity of a substantially central portion of said semiconductor laser element in said second direction.

11. The semiconductor laser device according to claim 1, wherein
said wire bonding portion is provided along said first direction corresponding to said extensional direction of said cavity.

12. The semiconductor laser device according to claim 1, wherein
a ridge portion connected to said electrode layer is formed on an upper surface of said semiconductor laser element, and
said wire bonding portion is provided on a region other than a region provided with said ridge portion.

13. The semiconductor laser device according to claim 1, wherein
said wire bonding portion is so provided as to protrude from said electrode layer in said second direction in plan view.

14. The semiconductor laser device according to claim 1, wherein
a ridge portion connected to said electrode layer is formed on an upper surface of said semiconductor laser element, and
a plurality of said ridge portions are so formed as to extend in said first direction at a prescribed interval in said second direction.

15. The semiconductor laser device according to claim 14, wherein
said wire bonding portion includes a connecting portion linking a plurality of said electrode layers formed to correspond to respective ones of said plurality of ridge portions of said semiconductor laser element with each other, and
said connecting portion is so formed around a region corresponding to a portion of said electrode layer provided with said wire bonding portion as to extend in said second direction.

16. A semiconductor laser device comprising:
a semiconductor laser element having a warp in a first direction corresponding to an extensional direction of a cavity;
an electrode layer formed on a surface of a concave side of said warp in said first direction and provided with a wire bonding portion; and
a base to which a convex side of said warp in said first direction is fixed, wherein
said semiconductor laser element further having a waveguide structure arranged at a prescribed distance to a center line in a second direction intersecting with said first direction and parallel to said center line,
said warp in said first direction is larger than a warp of said semiconductor laser element in said second direction,
said semiconductor laser element is so fixed to said base that a distance between said convex side and said base varies with said warp in said first direction, and
said wire bonding portion is provided around a portion opposed to said waveguide structure through said center line where said distance between said convex side and said base is substantially the smallest.

* * * * *